United States Patent
Malkin et al.

(10) Patent No.: US 9,485,039 B1
(45) Date of Patent: Nov. 1, 2016

(54) CALIBRATION AND TRACKING OF RECEIVER

(71) Applicant: APPLIED MICRO CIRCUITS CORPORATION, Sunnyvale, CA (US)

(72) Inventors: Moshe Malkin, Palo Alto, CA (US); Tarun Gupta, Santa Clara, CA (US)

(73) Assignee: APPLIED MICRO CIRCUITS CORPORATION, Santa Clara, CA (US)

( * ) Notice: Subject to any disclaimer, the term of this patent is extended or adjusted under 35 U.S.C. 154(b) by 0 days.

(21) Appl. No.: 14/736,874

(22) Filed: Jun. 11, 2015

(51) Int. Cl.
*H03M 1/10* (2006.01)
*H04B 17/21* (2015.01)

(52) U.S. Cl.
CPC ..................................... *H04B 17/21* (2015.01)

(58) Field of Classification Search
CPC .. H03M 1/1009; H03M 1/06; H03M 1/1038; H04B 1/30; H04B 1/38; H04B 1/408; H04B 17/20; H04B 17/14; H04B 17/10; H04B 17/11; H04B 17/21; H04L 27/368; H04L 25/08
USPC .......................... 341/118, 120; 375/295, 297
See application file for complete search history.

(56) References Cited

U.S. PATENT DOCUMENTS

| | | | |
|---|---|---|---|
| 6,963,742 | B2 | 11/2005 | Boros et al. |
| 7,190,742 | B2 | 3/2007 | Popescu et al. |
| 7,609,207 | B2 | 10/2009 | Lyons |
| 7,715,836 | B2 | 5/2010 | Vassiliou et al. |
| 7,818,028 | B2 | 10/2010 | Vassiliou et al. |
| 8,873,677 | B1 | 10/2014 | Loh et al. |
| 9,020,454 | B2 | 4/2015 | Waheed et al. |
| 9,071,262 | B1 * | 6/2015 | Malkin .................. H04B 17/21 |
| 2009/0027246 | A1 | 1/2009 | Hsueh et al. |
| 2010/0192027 | A1 * | 7/2010 | Johansson ........... H03M 1/0626 714/700 |
| 2011/0058596 | A1 * | 3/2011 | Agazzi ................ H03M 1/0626 375/232 |
| 2012/0001783 | A1 | 1/2012 | Eklund et al. |
| 2012/0007756 | A1 * | 1/2012 | Agazzi ................ H03M 1/0624 341/118 |
| 2013/0063608 | A1 * | 3/2013 | Tierney .................. H04L 43/08 348/192 |

FOREIGN PATENT DOCUMENTS

JP      2011-211393      10/2011

OTHER PUBLICATIONS

International Search Report & Written Opinion for PCT Application Serial No. PCT/US2015/042795, mailed Mar. 10, 2016, 11 pages.

* cited by examiner

*Primary Examiner* — Lam T Mai
(74) *Attorney, Agent, or Firm* — Amin, Turocy & Watson LLP

(57) ABSTRACT

Techniques for calibrating interleaved analog-to-digital converter (ADC) arrays are presented. A transceiver comprises an ADC component comprising an array of interleaved sub-ADCs, and an auxiliary path associated with an auxiliary sub-ADC used to facilitate calibrating a sampling array by comparing the auxiliary path signal to signals of the sub-ADCs in the array. A calibration component employs a phase-interpolator and analog delay lines to adjust the auxiliary sub-ADC to enable the auxiliary sub-ADC to be lined up to any one of the sampling instants of the sampling array. The calibration component compares the auxiliary signal to sub-ADC signals, determines path differences between the sub-ADC paths based on the comparison results, and calibrates the sub-ADCs and sub-ADC paths to reduce the path differences to mitigate distortion in a digital stream produced from combining the digital substreams produced by the sub-ADCs in the array.

24 Claims, 11 Drawing Sheets

CALIBRATION AND TRACKING OF RECEIVER

TECHNICAL FIELD

The subject disclosure relates generally to communication of information, and more particularly to calibration and tracking of a receiver.

BACKGROUND

Communication devices, such as transceivers, can be used to transmit or receive voice data or other data from other communication devices. The voice data or other data can be communicated via a wireline or wireless communication connection. One trend is to increase the amount of data that can be communicated and the speed of communication of data.

As communication data rates, speeds, and bandwidths grow, the circuits used to transmit, process, and receive data also have to process high bandwidth signals. One component used by many systems using digital signal processing is an analog-to-digital converter (ADC) that can be used to convert analog signals (e.g., voice signals) into a digital form for further digital signal processing. One approach for designing an ADC that can support relatively high bandwidth with high sampling speeds is to interleave an array of ADCs (e.g., an array of sub-ADCs), wherein each sub-ADC of the array can operate at a relatively lower speed. The lower sampling digital data samples from the sub-ADCs of the array can be combined to generate a high-speed digital data stream. This can enable the sub-ADCs of the array to operate at lower speeds and so the sub-ADCs can be designed with the limitation of current integrated circuit processing technology. A challenge with such a conventional interleaved ADC design can be that any processing differences between the sub-ADCs can contribute to the distortion of the combined digital stream. Such processing differences or mismatches can include, for example, different low-frequency offsets, bulk gains, delays, bandwidths, and more generally, different path transfer functions associated with the sub-ADCs of the array.

System designers often can attempt to design an ADC array such that these path differences can be relatively small. However, for more efficient area and power designs for high-speed communication systems, there can be undesirable power and area penalties incurred as well as more complex circuit designs being employed to keep these distortions at an acceptable level. These penalties can be significant and can contribute significantly to the system's power and area requirements, and it can therefore be desirable to avoid such penalties and power and area requirements.

Also, in conventional systems, auxiliary hardware, such as a digital-to-analog converter (DAC), often can be used and/or required to correct these distortions by generating a test/calibration signal that can be used to calibrate or correct the path differences. Such a conventional design can add to the cost and complexity of the system and/or can be of limited use, for example, if the test signal interferes with the communication channel's signal transmission. Thus, as a result, such calibration typically only can be allowed to be carried out during specific time periods before the actual data is received by the sampling array.

Another conventional method for correcting such distortions associated with an array of sub-ADCs can be using sampling arrays that can oversample the received signal. The information gleaned from oversampling the received signal can be used to calibrate and correct the processing path differences associated with the sub-ADCs. However, such conventional approach can significantly complicate the system design and can result in an undesirably higher amount of power and area being used for the system design because of the higher sampling speed used to obtain the oversampled channel signal.

Some other conventional methods for correcting such distortions associated with an array of sub-ADCs can include adding another receiving element that can enable detection of path differences associated with sub-ADCs using an auxiliary ADC. However, such methods also can depend on having some form of knowledge of the exact signal characteristics and can be of limited use. Further, these conventional methods also can be undesirably costly and can have complex and/or inefficient system designs.

The above-described description is merely intended to provide a contextual overview of current systems associated with transceivers and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, disclosed herein is a system that contains a converter component comprising a set of converter sub-components for converting respective time-delayed analog signals, associated with an analog signal received from a remote communication component, to respective digital data samples, and an auxiliary converter sub-component associated with an auxiliary path, wherein respective converter sub-components of the set of converter sub-components are associated with respective paths. The system can also contain a calibration component for determining path differences between the respective paths of the respective converter sub-components, based at least in part on a result of an analysis of an auxiliary signal associated with the auxiliary path and respective signals associated with the respective paths of the respective converter sub-components, to facilitate calibration of the respective converter sub-components to reduce the path differences, wherein the respective signals comprise the respective digital data samples.

In another example embodiment, disclosed herein is a method that involves determining path differences between respective paths of respective converter sub-components of a set of converter sub-components, based at least in part on a result of analyzing of an auxiliary signal associated with an auxiliary path that is associated with an auxiliary sub-component and respective signals associated with the respective paths of the respective converter sub-components of the set of converter sub-components, to facilitate calibrating the respective converter sub-components to mitigate the path differences. The method can also involve adjusting the respective converter sub-components or the respective paths to facilitate the mitigating of the path differences between the respective converter sub-components or the respective paths.

In yet another example embodiment, disclosed herein is a system that contains a means for determining path differences between respective paths of respective converter sub-components of a set of converter sub-components, based at least in part on a result of comparing an auxiliary signal associated with an auxiliary path that is associated with an auxiliary sub-component with respective signals associated with the respective paths of the respective converter sub-components of the set of converter sub-components, to facilitate calibrating the respective converter sub-components to reduce the path differences. The system can also contain a means for calibrating the respective converter sub-components or the respective paths to facilitate the reducing of the path differences between the respective converter sub-components or the respective paths.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
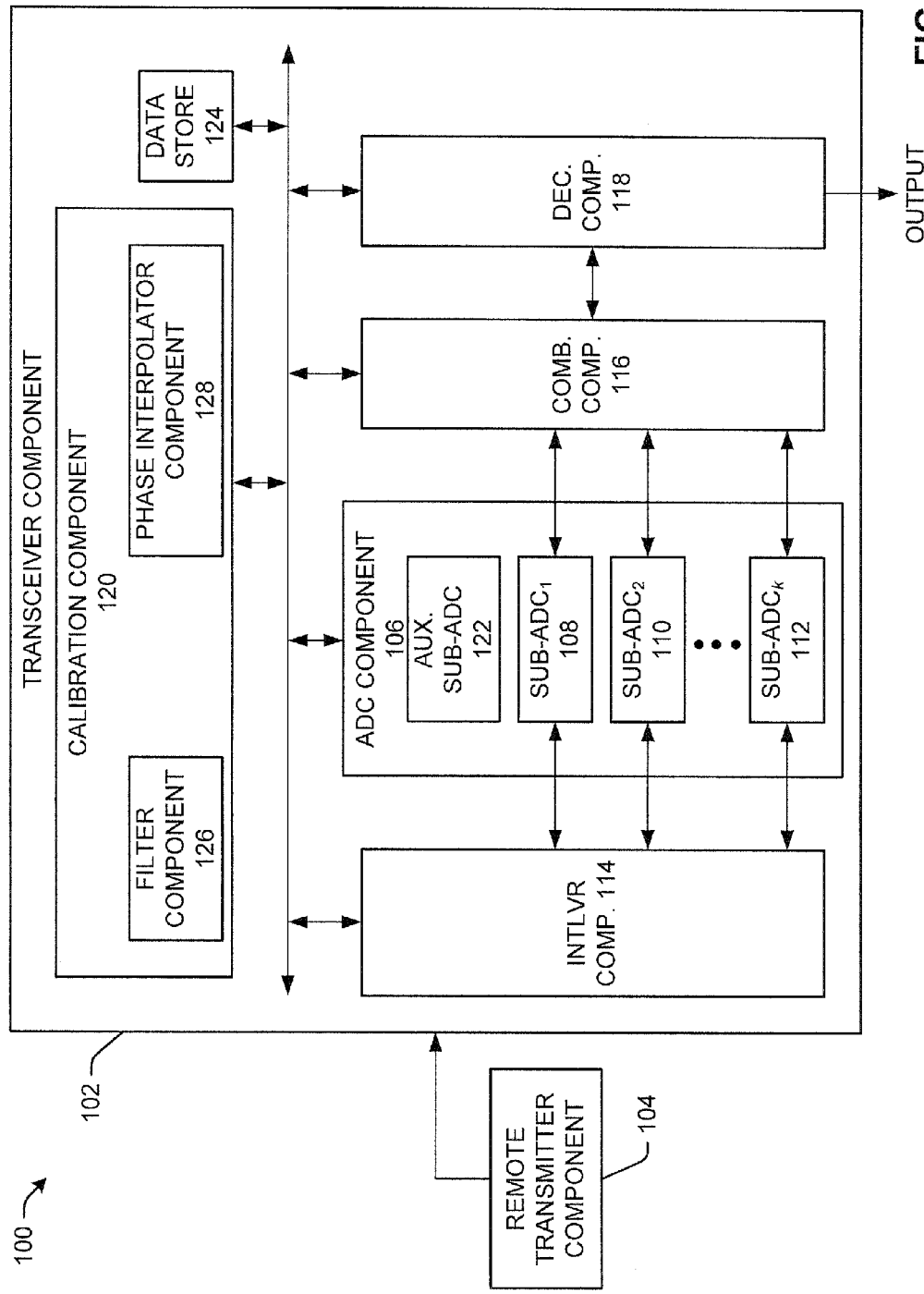
FIG. 1 illustrates a block diagram of an example, non-limiting system that can facilitate calibrating sub-analog-to-digital converters (sub-ADCs) of an array of sub-ADCs of a transceiver component to facilitate correcting or mitigating sub-ADC path differences, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

Techniques for calibrating interleaved analog-to-digital converter (ADC) arrays are presented. A transceiver component can comprise an ADC component comprising an array of interleaved ADC sub-components (also referred to herein as sub-ADCs), and an auxiliary path associated with an auxiliary sub-ADC that can be used to facilitate calibrating the sub-ADCs in the array by comparing the auxiliary path signal to signals of the sub-ADCs in the array. The auxiliary path can be designed to closely match the processing paths of the other sub-ADCs.

The transceiver component can receive signals (e.g., analog signals), comprising data, from a remote transmitter component (e.g., a transmitter, a transceiver, or another type of communication device). When an analog signal is received by the transceiver component, an interleaver component can interleave the received analog signal across the sub-ADCs of the array, wherein the interleaver component or a calibration component can process the analog signal to implement or introduce respective time delays to the analog signal to generate a set of time-delayed analog signals (e.g., having respective time delays) prior to it being input to the respective sub-ADCs of the array. The sub-ADCs of the array, and/or another component(s) of the transceiver component, can process (e.g., sample, convert, decode, and/or otherwise process) the respective time-delayed analog signals to facilitate recovering (e.g., facilitate determining, identifying, decoding, and/or decrypting, etc.) the data (e.g., in digital form) sent by the remote transmitter.

The transceiver component can comprise a calibration component that can be associated with the auxiliary sub-ADC and the sub-ADCs in the array. The calibration component can employ a phase-interpolator and/or analog delay lines to adjust the auxiliary sub-ADC to enable the sampling of the auxiliary sub-ADC to be lined up to any one of the sampling instants of the sub-ADCs in the array. An auxiliary path sampling rate, phase-interpolator, and analog delay lines can be designed (e.g., by the calibration component or another component) to facilitate establishing an initial match between respective sampling instants of the auxiliary sub- ADC and another sub-ADC in the array, and the sub-ADCs in the array can thereby be calibrated because it is known the sampling clock of the auxiliary path passes through all the sampling points of the sub-ADCs in the array. The calibration component also can determine and/or set the rate at which the auxiliary sub-ADC for the auxiliary path (e.g., auxiliary signal or sampling path) operates such that the auxiliary sub-ADC can pass through the sampling times of all of the desired samples from the actual sampling array to facilitate determining path differences between the auxiliary sub-ADC and the sub-ADCs in the array.

The calibration component can compare the auxiliary signal to sub-ADC signals (e.g., compare the auxiliary samples at sampling instants with the respective samples of the sub-ADCs in the array at respective sampling instants). The calibration component can determine path differences (e.g., timing skew, bandwidth differences, or other path differences) between the sub-ADC paths (e.g., sub-ADC signal or sampling paths) based at least in part on the results of the comparison of the auxiliary signal and the respective sub-ADC signals. The calibration component also can determine a calibration to apply to the sub-ADCs or sub-ADC paths, and can calibrate the sub-ADCs and sub-ADC paths, based at least in part on the determined calibration (e.g., calibration metric) to correct or reduce the path differences to mitigate distortion in a digital stream produced from combining the digital substreams produced by the sub-ADCs in the array.

The respective sub-ADCs of the array, as calibrated by the calibration component, can facilitate providing respective digital data substreams, which can correspond to the received signal (e.g., analog signal), as an output. The ADC component or another component (e.g., a combiner component) can combine, integrate, or deinterleave the respective digital data substreams of the respective sub-ADCs to generate a digital data stream that can accurately represent the data contained in the received analog signal.

These and other aspects and implementations of the disclosed subject matter will now be described in connection with the figures.

FIG. 1 illustrates a block diagram of an example, non-limiting system 100 that can facilitate calibrating sub-ADCs of an array of sub-ADCs of a transceiver component to facilitate correcting or mitigating sub-ADC path differences, in accordance with various aspects and embodiments of the disclosed subject matter. The system 100 can be or can comprise, for example, a high-speed communication and/or sampling system that can perform analog to digital conversion of analog signals at a desirably high rate of speed. The system 100 can be used to facilitate voice or data communications at one or more desired speeds, such as, for example, 10 gigabit per second (G), 40G, 100G, and/or a faster or different communication rate of speed. The system 100 can be employed in connection with an electrical transceiver, an optical transceiver, a wireless transceiver, a backplane transceiver, a chip-to-chip transceiver, or any of a variety of other types of transceivers.

The system 100 can comprise a transceiver component 102 (e.g., transceiver) that can be employed to communicate traffic (e.g., voice or data traffic), wherein the transceiver component 102 can receive traffic from a communication device, such as a remote transmitter component 104, and can transmit traffic to another communication device. The transceiver component 102 can be, or can be part of, a device that can communicate traffic. For example, the transceiver component 102 can be, or can be part of, a modem or router (e.g., a 10G modem or router (e.g., a 10G-baseT modem or router), a 40G modem or router (e.g., a 40G-baseT modem or router), a 100G modem or router (e.g., a 100G-baseT modem or router), or a modem or router that can employ another (e.g., a faster or different) communication rate), a switch that can facilitate communication of traffic, a communication device that can employ optical communications technology and/or wireless communications technology, or another type of communication device.

The transceiver component 102 can comprise one or more (e.g., 1, 2, 3, 4, . . . ) transmitters and one or more (e.g., 1, 2, 3, 4, . . . ) receivers that can facilitate transmitting and receiving voice or data communications. In some implementations, the transceiver component 102 can employ a full-duplex system that can allow simultaneous communication in both directions. The transceiver component also can employ one or more sensing devices such as one or more antennas that can facilitate voice or data communications.

The transceiver component 102 also can comprise an ADC component 106 that can convert analog signals received from another communication device, such as the remote transmitter component 104, to corresponding digital signals. The ADC component 106 can comprise a set of ADC sub-components (also referred to herein as sub-ADCs) that can be employed to process received signals (e.g., to convert received analog signals to corresponding digital signals). The set of ADC sub-components can comprise, for example, ADC sub-component$_1$ 108, ADC sub-component$_2$ 110, up through ADC sub-component$_k$ 112, wherein k can be virtually any desired number. The set of ADC sub-components (e.g., 108, 110, 112, etc.) can be structured in the form of an array of ADC sub-components that can be interleaved and can operate in parallel to facilitate supporting a desired high bandwidth and performing high-speed processing of the received signals, as more fully disclosed herein.

To facilitate interleaving the sub-ADCs, the transceiver component 102 also can comprise an interleaver component 114 (INTLVR COMP.) that can be employed to interleave the received analog signal across the respective interleaved sub-ADCs (e.g., 108, 110, 112, etc.) of the array, wherein the interleaver component 114 or the calibration component 120 can process the analog signal to implement or introduce respective time delays to the analog signal to generate time-delayed analog signals (e.g., having respective time delays) prior to the signal being input to the ADC component 106. The interleaver component 114 can comprise a desired number of outputs, such as k outputs, that can provide the time-delayed analog signals (e.g., with respective delays) to the respective inputs of the respective sub-ADCs (e.g., 108, 110, 112, etc.). The respective sub-ADCs (e.g., 108, 110, 112, etc.) can sample or perform other processing on the respective time-delayed analog signals at the specified sampling or processing rate of the sub-ADCs to facilitate determining an analog value of each data sample and converting or digitizing the analog value of the data sample to a corresponding digital value to generate a corresponding digital data sample to facilitate recovering the data from the respective time-delayed analog signals.

For instance, the respective sub-ADCs (e.g., 108, 110, 112, etc.) can operate at a relatively lower speed to process (e.g., sample, convert or digitize, and/or otherwise process) the respective portions of the received signals, but due in part to the interleaving and parallel operation of the sub-ADCs (e.g., 108, 110, 112, etc.), the combined operation of the respective sub-ADCs (e.g., 108, 110, 112, etc.) can enable the ADC component 106 to process the received signals at a desirably high speed to produce a corresponding digital data stream as an output. For example, the respective digital data samples from the respective sub-ADCs (e.g., 108, 110, 112, etc.) produced at a relatively lower speed can be combined (e.g., by a combiner component 116 (COMB. COMP.)) to generate a higher speed digital data stream, wherein the higher speed of the generated digital data stream can be a function of the number of sub-ADCs and the sampling or processing speed of the sub-ADCs. As a specific non-limiting example, if it is desired to have the ADC component 106 convert analog to signals to digital signals at a rate of 10G, and if it is desired to use 1G sub-ADCs (e.g., sampling or processing at 1G each) to form the ADC component 106, the ADC component 106 can be configured to comprise 10 1G sub-ADCs that can be interleaved and can operate in parallel to facilitate processing received analog signals, wherein k=10. The interleaving, and parallel operation, of the 10 sub-ADCs can facilitate enabling the ADC component 106 to process received analog signals at a rate of 10G.

The respective sub-ADCs (e.g., 108, 110, 112, etc.) of the array, and/or another component(s), such as a decoder component 118 (DEC. COMP.), of the transceiver component 102, can process (e.g., sample, convert or digitize, decode, and/or otherwise process (e.g., decrypt)) the analog signal to facilitate recovering (e.g., facilitate determining, identifying, etc.) the data (e.g., in digital form) received by the transceiver component 102 from the remote transmitter component 104. For instance, each of the respective sub-ADCs can sample the analog signal to generate a sample of the analog signal, and the sample can be converted or digitized to generate a digital data sample. The respective sub-ADCs can provide (e.g., communicate) the respective digital data samples to the combiner component 116, which can combine or integrate the respective digital data samples to generate a digital data stream. The combiner component 116 can send (e.g., communicate) the digital data stream to the decoder component 118. The decoder component 118 can decode the digital data stream, comprising the combined digital data samples from the respective sub-ADCs, to facilitate recovering (e.g., generating, determining, identifying, etc.) the data from the digital data samples.

One challenge with interleaved ADC designs can be that any processing differences between the sub-ADCs can contribute to the distortion of the combined digital stream. When using an interleaved array of sub-ADCs, there can be processing path differences between the respective paths of the sub-ADCs of the array. Such path differences can cause distortion in the digital data stream when the digital data substreams of the sub-ADCs are combined. Such processing differences or mismatches can include, for example, different timing skews or delays, different low-frequency offsets, different bulk gains, different bandwidths, and more generally, different path transfer functions between the respective paths of the sub-ADCs of the array.

To facilitate mitigating these processing differences and performing other operations, the transceiver component 102 can comprise a calibration component 120 that can respectively calibrate or adjust respective sub-ADCs (e.g., 108, 110, 112, etc.) of the array and/or information or paths (e.g., sub-ADC paths) associated with the respective arrays to facilitate correcting or mitigating the respective sub-ADC path differences associated with the respective sub-ADCs. This can facilitate mitigating distortions that would otherwise have been caused as a result of the uncorrected or unmitigated path differences associated with the sub-ADCs. The calibration component 120 can perform such calibration or adjustment of the sub-ADCs (e.g., 108, 110, 112, etc.) at virtually any desired time, such as, for example, during start-up of the ADC component 106 or associated device (e.g., transceiver component 102), during showtime, during or in connection with a data transfer associated with the transceiver component 102, periodically, in response to occurrence of a condition (e.g., in response to detection of a condition) associated with the transceiver component 102, the ADC component 106, or other component, and/or at another desired time.

To facilitate enabling the calibration component 120 to calibrate or adjust the sub-ADCs (e.g., 108, 110, 112, etc.) of the array, the ADC component 106 also can comprise an auxiliary ADC sub-component 122 (also referred to herein as an auxiliary sub-ADC or a calibration sub-ADC, and AUX. SUB-ADC in the figures) that can be associated with (e.g., communicatively connected to or part of) an auxiliary path of the ADC component 106. The calibration component 120 can employ, and can control the operation of, the auxiliary sub-ADC 122 (and associated auxiliary path) to facilitate calibrating the array of sub-ADCs (e.g., 108, 110, 112, etc.) (also referred to herein as the sampling array), for example, by comparing the auxiliary path signal to the signals of the other processing paths of the array of sub-ADCs (e.g., 108, 110, 112, etc.) to facilitate determining and correcting path differences between paths of the sub-ADCs (e.g., 108, 110, 112, etc.).

To facilitate desirable (e.g., optimal, accurate, acceptable) calibration of the sub-ADCs (e.g., 108, 110, 112, etc.), the auxiliary path (also referred to herein as the auxiliary sampling path or sub-ADC path), including the auxiliary sub-ADC 122, can be designed to closely (e.g., substantially) match the processing paths of the other sub-ADCs of the array. For instance, the auxiliary path can closely or substantially match the signal path associated with the sub-ADCs (e.g., 108, 110, 112, etc.) with respect to programmable gain amplifiers (PGAs), bandwidth, samplers, buffers, and/or other features or components associated with the sub-ADC paths of the ADC component 106.

In some implementations, to reduce the amount of power consumed by the auxiliary sub-ADC 122 in connection with the auxiliary path, the auxiliary sub-ADC 122 can be configured to operate (e.g., run) at a rate that can be lower (e.g., operate at a lower resolution) than the full system rate (e.g., operate at a rate that can be lower than the rate of the other sub-ADCs (e.g., 108, 110, 112) of the ADC component 106). The calibration component 120 also can determine and/or set the rate at which the auxiliary sub-ADC 122 for the auxiliary path (e.g., auxiliary processor or sampling path) operates such that the auxiliary sub-ADC 122 can pass through the sampling times of all of the desired samples from the array of sub-ADCs (e.g., 108, 110, 112, etc.).

Figure 2:
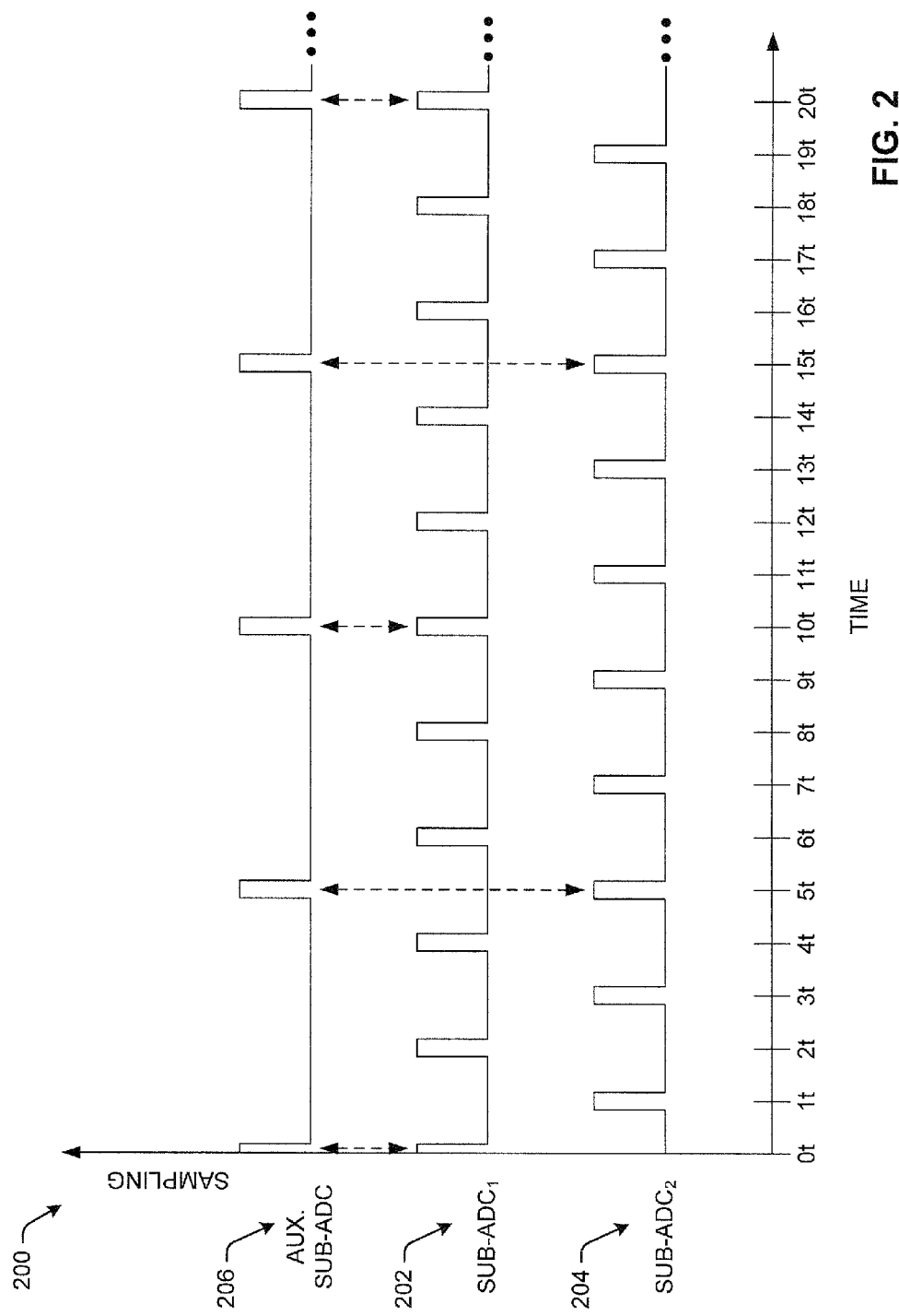
FIG. 2 presents an illustration of an example sampling timing diagram illustrating sampling by an auxiliary sub-ADC, a first sub-ADC, and a second sub-ADC of the sub-ADC array, in accordance with various aspects and implementations of the disclosed subject matter.

Referring to FIG. 2 (along with FIG. 1), FIG. 2 presents an illustration of an example sampling timing diagram 200 illustrating sampling by the auxiliary sub-ADC 122, a first sub-ADC (e.g., sub-ADC$_1$ 108), and a second sub-ADC (e.g., sub-ADC$_2$ 110) of the sub-ADC array, in accordance with various aspects and implementations of the disclosed subject matter. The calibration component 120 (or another component) can set the respective sample rates and times of the respective sub-ADCs (e.g., 108, 110, 112, etc.) such that the respective sub-ADCs can be sampled at different times with respect to each other. In the system 100, the respective sampling times of a first set of samples performed by the auxiliary sub-ADC 122 can coincide with respective sampling times of a first set of samples performed by a first sub-ADC (e.g., 108) in the array, the respective sampling times of a second set of samples performed by the auxiliary sub-ADC 122 can coincide with respective sampling times of a second set of samples performed by a second sub-ADC (e.g., 108) in the array, and so on.

As an illustrative example with regard to a sub-ADC array of two sub-ADCs (e.g., sub-ADC$_1$ 108, sub-ADC$_2$ 110) (plus the auxiliary sub-ADC 122, which does not carry actual data from the received analog signal), the calibration component 120 (or another component) can set the sub-ADC$_1$ 108 (or associated sampler component) to sample a first analog signal on a first path at times 0t, 2t, 4t, 6t, 8t, 10t, 12t, 14t, 16t, 18t, 20t, and so on, as illustrated at reference numeral 202 in FIG. 2. The calibration component 120 (or another component) also can set the sub-ADC$_2$ 110 (or associated sampler component) to sample a second analog signal on a second path at times 1t, 3t, 5t, 7t, 9t, 11t, 13t, 15t, 17t, 19t, and so on, as illustrated at reference numeral 204 in FIG. 2. To facilitate enabling sampling by the auxiliary sub-ADC 122 to pass through the respective sampling times of all of the desired samples from the array of sub-ADCs (e.g., 108, 110), the calibration component 120 can set the auxiliary sub-ADC 122 to have a sampling rate, such as, for example, sampling every 5t, that can be lower than the full system rate used for the array of sub-ADCs (e.g., 108, 110) such that the auxiliary sub-ADC 122 (or an associated auxiliary sampler component) can sample the auxiliary signal at 0t, 5t, 10t, 15t, 20t, and so on, as illustrated at reference numeral 206 in FIG. 2.

As can be seen, at times 0t, 10t, 20t, and so on, there are samples for the first path associated with sub-ADC$_1$ 108 and auxiliary samples for the auxiliary path associated with the auxiliary sub-ADC 122, and at times 5t, 15t, 25t, and so on, there are samples for the second path associated with sub-ADC$_2$ 110 and auxiliary samples for the auxiliary path associated with the auxiliary sub-ADC 122. Thus, the auxiliary sub-ADC 122 has been set to pass through sampling times (e.g., at least some of the (even numbered)-t sampling times, at least some of the (odd numbered)-t sampling times) of all of the desired samples from the array of sub-ADCs (e.g., 108, 110), as there are times when the auxiliary signal on the auxiliary path is sampled at (or at least substantially near) the same time the first signal is sampled on the first path, there are other times when the auxiliary signal on the auxiliary path is sampled at (or at least substantially near) the same time as the second signal is sampled on the second path, and there are no sub-ADCs in the array for which the auxiliary sub-ADC 122 (or associated auxiliary sampler component) does not sample the auxiliary signal on the auxiliary path at the same (or substantially same) time as a signal on a path of a sub-ADC is sampled for at least a portion of the samples of that sub-ADC.

With further regard to FIG. 1, the calibration component 120 can monitor and track the respective sampling of the respective sub-ADCs (e.g., 108, 110, 112, etc.) and the sampling of the auxiliary sub-ADC 122. The calibration component 120 can receive, sample, collect, or otherwise obtain information relating to, for example, the auxiliary samples of the auxiliary path and the respective samples from the respective paths of the respective sub-ADCs (e.g., 108, 110, 112, etc.) of the array that correspond to the same times as the auxiliary samples. For instance, with regard to the above illustrative example, for the sampling at times 0t, 10t, 20t, 30t, and so on, the calibration component 120 can obtain information relating to the auxiliary samples and the samples of the first signal on the first path at those sampling times 0t, 10t, 20t, 30t, and so on. For the sampling at times 5t, 15t, 25t, 35t, and so on, the calibration component 120 can obtain information relating to the auxiliary samples and the samples of the second signal on the second path at those sampling times 5t, 15t, 25t, 35t, and so on. If there were other respective sub-ADCs of the sub-ADC array, the calibration component 120 also can obtain information relating to the auxiliary samples and the respective samples of the other signals on the other respective paths at other respective sampling times (e.g., wherein, if there were other sub-ADCs in the array, the auxiliary sampling time of the auxiliary path can have a different rate to enable the auxiliary sub-ADC 122 to pass through the sampling times of all of the desired samples for all sub-ADCs (e.g., 108, 110, 112, etc.) in the sub-ADC array).

The calibration component 120 can store the obtained information relating to the auxiliary samples of the auxiliary path and the respective samples from the respective paths of the respective sub-ADCs (e.g., 108, 110, 112, etc.) of the array that correspond to the same times as the auxiliary samples in a data store 124 for later analysis or can analyze such information prior to storing it in the data store 124. The calibration component 120 can analyze the obtained sample-related information, for example, by comparing the auxiliary samples associated with the auxiliary sub-ADC 122 to respective corresponding samples (e.g., corresponding by time of sample) associated with the respective sub-ADCs (e.g., 108, 110, 112, etc.) of the array. For example, the calibration component 120 can analyze the obtained sample-related information to determine differences, if any between the information relating to the auxiliary samples for the auxiliary sub-ADC 122 and the samples for sub-ADC$_1$ 108 at the respective times (e.g., 0t, 10t, 20t, 30t, and so on) that those respective samples occurred. The calibration component 120 also can analyze the obtained sample-related information to determine differences, if any between the information relating to the auxiliary samples for the auxiliary sub-ADC 122 and the samples for sub-ADC$_2$ 110 at the respective times (e.g., 5t, 15t, 25t, and so on) that those respective samples occurred.

In some implementations, to facilitate determining path differences between the paths of the sub-ADCs (e.g., 108, 110, 112, etc.) (and/or between the paths of the sub-ADCs and the auxiliary path), for all or a desired portion of the samples, the calibration component 120 can determine (e.g., calculate) the squared error differences between an auxiliary sample for the auxiliary sub-ADC 122 and a corresponding sample associated with a sub-ADC, wherein a sample is a corresponding sample with respect to the auxiliary sample when it occurs at a same (or substantially the same) time instant as the auxiliary sample occurs. For example, for auxiliary sample $x_1$ at time 10t and sample y for sub-ADC$_1$ 108 at the same time instant of 10t, the calibration component 120 can determine (e.g., calculate) the squared error difference between auxiliary sample $x_1$ for the auxiliary sub-ADC 122 and sample y associated with the sub-ADC$_1$ 108 (e.g., squared difference error (for y, $x_1$)=$(y-x_1)^2$). For auxiliary sample $x_2$ at time 15t and sample z for sub-ADC$_2$ 110 at the same time instant of 15t, the calibration component 120 can determine the squared error difference between auxiliary sample $x_2$ for the auxiliary sub-ADC 122 and sample z associated with the sub-ADC$_2$ 110 (e.g., squared difference error (for z, $x_2$)=$(y-x_2)^2$).

The calibration component 120 can determine the path differences (e.g., a path difference metric) between the paths of the sub-ADCs (e.g., 108, 110, 112, etc.) (and/or between the auxiliary sub-ADC 122 and the sub-ADC), based at least in part on the results of the analysis of the obtained sample-related information (e.g., based at least in part on differences between the auxiliary samples and the corresponding samples for the sub-ADC$_1$ 108, differences between the auxiliary samples and the corresponding samples for the sub-ADC$_2$ 110, and/or the respective squared difference errors associated with the respective samples). Based at least in part on the determined path differences between the paths, the calibration component 120 also can determine calibrations or adjustments that can be made to the sub-ADCs (e.g., 108, 110, 112, etc.) to correct, mitigate, reduce, or minimize path differences between the paths of the sub-ADCs (e.g., 108, 110, 112, etc.) (and/or between the auxiliary sub-ADC 122 and the sub-ADC).

To facilitate correcting, mitigating, reducing, or minimizing path differences between the paths, the calibration component 120 can generate control information (e.g., control commands or instructions) relating to the calibrations or adjustments, can determine a filter (e.g., analog filter, digital filter) that can be applied by a filter component 126 to a path(s) to filter data signals or samples on the path(s) to facilitate calibrating or adjusting a sub-ADC or associated path, can determine a delay line(s) (e.g., analog delay line(s)) that can be applied to path(s) to facilitate calibrating or adjusting a sub-ADC or associated path, and/or can make other determinations or perform other operations that can facilitate calibrating or adjusting the sub-ADCs (e.g., 108, 110, 112, etc.) or associated paths.

The calibration component 120 can communicate the control information to one or more of the sub-ADCs (e.g., 108, 110, 112, etc.) to modify the operation, parameters, etc., of the one or more sub-ADCs, and/or can communicate control information to the filter component 126 to facilitate generating or setting a desired filter(s) that can be applied to a path(s), to correct, mitigate, reduce, or minimize path differences between the paths of the sub-ADCs (e.g., 108, 110, 112, etc.) (and/or between the auxiliary sub-ADC 122 and the sub-ADC). In addition or alternatively, the calibration component 120 can apply a delay line(s) to a sub-ADC path(s) and/or can perform other operations that can facilitate calibrating or adjusting the sub-ADCs (e.g., 108, 110, 112, etc.) and associated paths.

The collecting of the sample-related information associated with the auxiliary path of the auxiliary sub-ADC 122 and the paths of the sub-ADCs (e.g., 108, 110, 112, etc.), analyzing of the sample-related information, determining path differences between paths of the sub-ADCs, determining calibrations for the sub-ADCs (or associated sub-ADC paths) to mitigate path differences, and/or calibrations of the sub-ADCs (or associated sub-ADC paths) can be performed in parallel by the calibration component 120 and/or other components (e.g., sampler component, processor component, etc.). Also, the calibration component 120 and other components (e.g., sampler component, processor component, filter component 126, phase interpolator component 128, etc.) can perform the various operations relating to calibrating the sub-ADCs of the array as part of background operations (e.g., in data processing mode, while analog-to-digital data conversions are being performed by the ADC component 106) or foreground operations (e.g., when the ADC component 106 is not in data processing mode).

To facilitate desired (e.g., optimal, suitable, acceptable) operation of transceiver component 102, including the calibration component 120 and ADC component 106, and conversion of a received analog data stream to a digital data stream, the calibration component 120 can facilitate aligning or calibrating (e.g., initially aligning or calibrating, re-aligning or re-calibrating) the auxiliary sub-ADC 122 with or to a sub-ADC (e.g., 108, 110, or 112) of the sub-ADC array, in accordance with a defined alignment algorithm, as disclosed herein. In some implementations, the calibration component 120 can comprise or be associated with a phase interpolator component 128 that can be associated with the auxiliary sub-ADC 122 to facilitate adjusting a phase and/or time difference between the auxiliary sub-ADC 122 and a sub-ADC to facilitate aligning or calibrating the auxiliary sub-ADC 122 with or to the sub-ADC. For instance, the phase interpolator component 128 can enable the auxiliary sub-ADC 122 to be lined up to any one of the sampling instants of a sub-ADC (e.g., 108, 110, or 112) of the array of sub-ADCs. The calibration component 120 also can employ delay lines (e.g., analog delay lines) that can be applied to an auxiliary path associated with an auxiliary sub-ADC 122 or a path associated with a sub-ADC (e.g., 108, 110, or 112) to facilitate delaying an auxiliary signal or signal, respectively, to facilitate aligning or calibrating the auxiliary sub-ADC 122 with or to the sub-ADC. An auxiliary path sampling rate, a phase interpolator of the phase interpolator component 128, and analog delay lines can be suitably designed or controlled (e.g., by the calibration component 120) to facilitate establishing an initial match (or at least substantial match) between sampling instants of the auxiliary sub-ADC 122 and another sub-ADC(s) (e.g., 108, 110, or 112) in the array.

In some implementations, the calibration component 120 can control the phase interpolator component 128 to adjust the phase of the auxiliary sub-ADC 122 for the auxiliary path and/or can facilitate adjusting or selecting an analog delay line associated with the auxiliary path to facilitate performing an alignment (e.g., initial alignment) of the auxiliary sub-ADC 122 and auxiliary path with the sub-ADC and associated sub-ADC path. For each phase interpolator delay and analog delay line delay, the calibration component 120 can examine (e.g., analyze, evaluate) the samples of all of the other sub-ADCs (e.g., 108, 110, 112, etc.) of the array for each one of their analog delay lines to determine whether the auxiliary sub-ADC 122 is aligned with a sub-ADC. If the calibration component 120 determines that the auxiliary sub-ADC 122 is not yet suitably aligned with a sub-ADC, the calibration component 120 can apply or make further adjustments to the phase interpolator delay via the phase interpolator component 128 and/or analog delay line, and can again examine the sample of the auxiliary sub-ADC 122 with respect to the samples of all of the other sub-ADCs (e.g., 108, 110, 112, etc.) of the array along their paths to determine whether the auxiliary sub-ADC 122 is aligned with a sub-ADC of the array, in accordance with the defined alignment algorithm.

Figure 3:
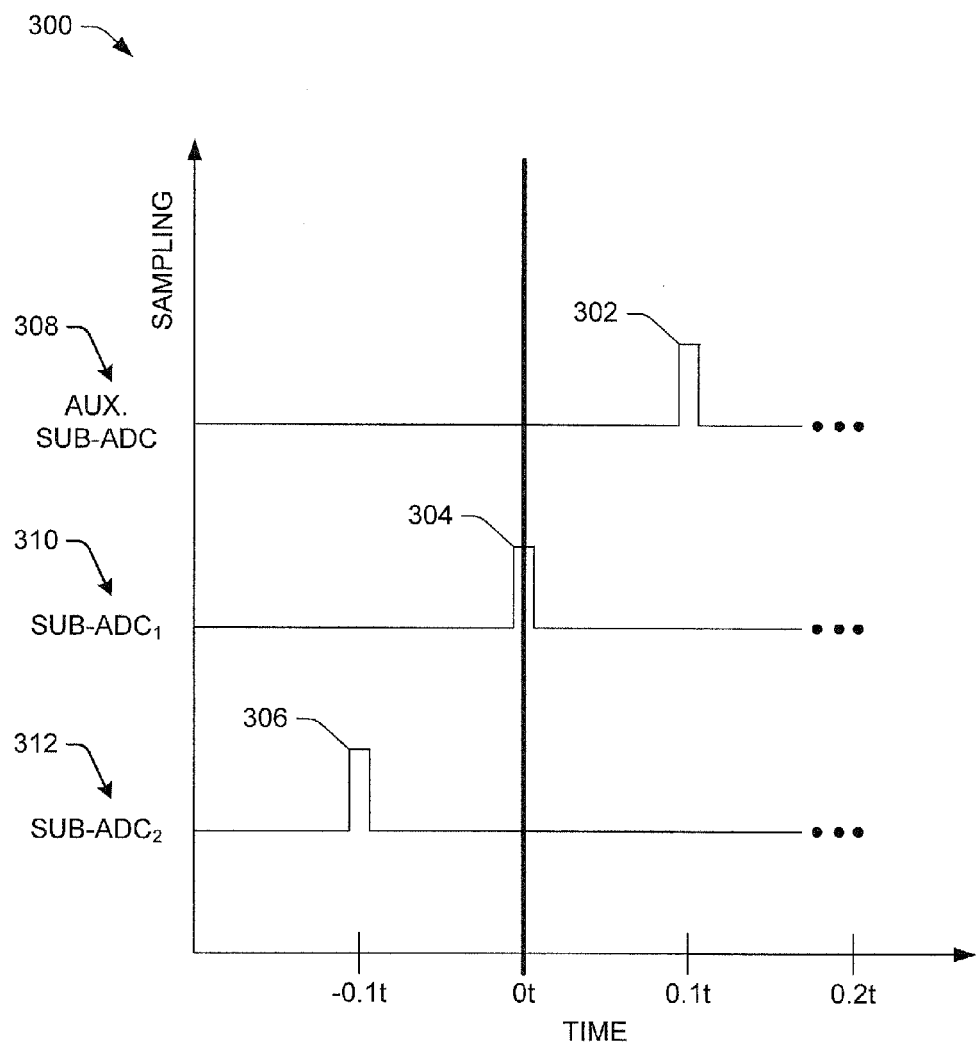
FIG. 3 presents an illustration of an example sampling timing diagram illustrating sampling instants of the auxiliary sub-ADC, the first sub-ADC, and the second sub-ADC of the sub-ADC array, in accordance with various aspects and implementations of the disclosed subject matter.
Figure 4:
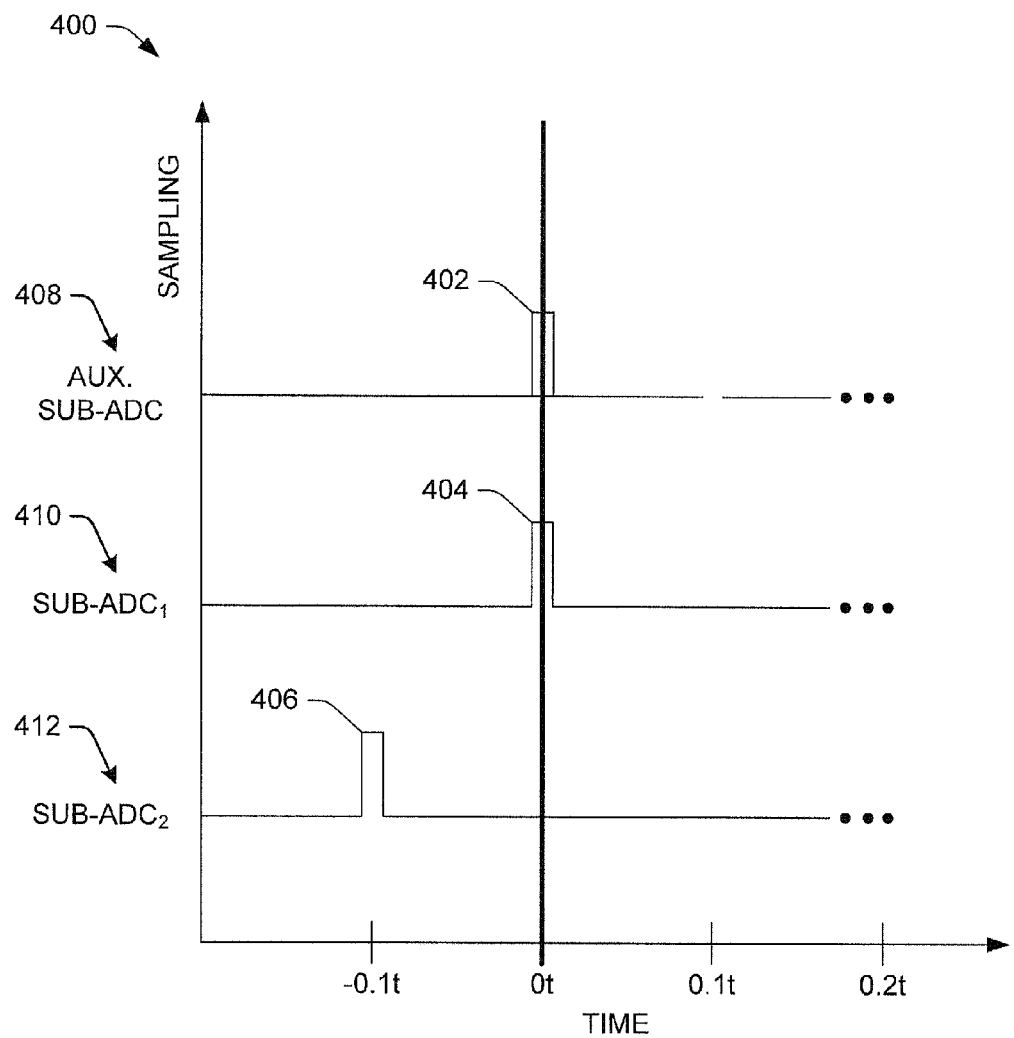
FIG. 4 presents an illustration of an example sampling timing diagram illustrating sampling instants of the auxiliary sub-ADC, the first sub-ADC, and the second sub-ADC of the sub-ADC array, after adjustment to align the auxiliary sub-ADC with the first sub-ADC, in accordance with various aspects and implementations of the disclosed subject matter.

Referring briefly to FIG. 3 and FIG. 4 (along with FIG. 1), FIG. 3 depicts an illustration of an example sampling timing diagram 300 illustrating sampling instants of the auxiliary sub-ADC 122, a first sub-ADC (e.g., sub-ADC$_1$ 108), and a second sub-ADC (e.g., sub-ADC$_2$ 110) of the sub-ADC array, in accordance with various aspects and implementations of the disclosed subject matter. FIG. 4 presents an illustration of an example sampling timing diagram 400 illustrating sampling instants of the auxiliary sub-ADC 122, a first sub-ADC (e.g., sub-ADC$_1$ 108), and a second sub-ADC (e.g., sub-ADC$_2$ 110) of the sub-ADC array, after adjustment to align the auxiliary sub-ADC 122 with the first sub-ADC (e.g., sub-ADC$_1$ 108), in accordance with various aspects and implementations of the disclosed subject matter.

As depicted in the sampling timing diagram 300 of FIG. 3, initially or at some point in the initialization process, the sampling instant 302 for the auxiliary sub-ADC 122 can be out of alignment from the sampling instant 304 for the sub-ADC$_1$ 108 and the sampling instant 306 for the sub-ADC$_2$ 110. For instance, as shown at reference numeral 308 for the sampling of the auxiliary sub-ADC 122, at reference numeral 310 for the sampling of sub-ADC$_1$ 108, at reference numeral 312 for the sampling of sub-ADC$_2$ 110, respectively, the sampling instant 302 is shown as occurring at 0.1t, the sampling instant 304 is shown as occurring at 0.0t, and the sampling instant 306 is shown as occurring at −0.1t. The calibration component 120 can obtain and analyze this sampling-related information presented in the sampling timing diagram 300. Based at least in part on the results of the analysis, the calibration component 120 can determine that the auxiliary sub-ADC 122 is not desirably aligned with any sub-ADC (e.g., 108, 110) of the array, and can determine that an adjustment is to be made to the auxiliary sub-ADC 122 or associated path to facilitate aligning the auxiliary sub-ADC 122 with a sub-ADC of the array, in accordance with the defined alignment algorithm.

The calibration component 120 can determine a time adjustment amount, or can use a defined (e.g., predefined) time adjustment amount (e.g., −0.1t, +0.1t, or some other desired time adjustment amount), to apply to the auxiliary sampling time or auxiliary path to facilitate adjusting the auxiliary sampling time or auxiliary path to facilitate aligning (or substantially (e.g., suitably) aligning) the auxiliary sub-ADC 122 (and associated auxiliary path) with a sub-ADC (and associated path) of the array, in accordance with the defined alignment algorithm. The calibration component 120 can use the phase interpolator component 128 and/or an analog delay line to facilitate adjusting the timing of the sampling of the auxiliary signal on the auxiliary path, such as disclosed herein.

As depicted in the sampling timing diagram 400 of FIG. 4, after the sampling timing adjustment has been performed on the auxiliary path, the sampling instant 402 for the auxiliary sub-ADC 122 can be aligned with the sampling instant 404 for the sub-ADC$_1$ 108, but is not aligned with the sampling instant 406 for the sub-ADC$_2$ 110. For instance, as shown at reference numeral 408 for the sampling of the auxiliary sub-ADC 122, at reference numeral 410 for the sampling of sub-ADC$_1$ 108, at reference numeral 412 for the sampling of sub-ADC$_2$ 110, respectively, the sampling instant 402 is now shown as occurring at time 0.0t, the sampling instant 404 is shown as occurring at time 0.0t, and the sampling instant 406 is shown as occurring at time −0.1t.

The calibration component 120 can obtain and analyze this sampling-related information presented in the sampling timing diagram 400. Based at least in part on the results of the analysis, the calibration component 120 can identify or determine that the sampling instant 402 (e.g., occurring at 0.0t) for the auxiliary sub-ADC 122 occurs at the same time as the sampling instant 404 (e.g., occurring at 0.0t) for the sub-ADC$_1$ 108. Since the sampling instant 402 is determined to occur at the same time as the sampling instant 404, the calibration component 120 can determine that the auxiliary sub-ADC 122 is desirably aligned with sub-ADC$_1$ 108, and can determine that no further adjustment needs to be made to the auxiliary sub-ADC 122 or associated auxiliary path with respect to the alignment process, in accordance with the defined alignment algorithm.

As another illustrative example, if, instead, an analog signal of a sub-ADC (e.g., 108, 110, or 112) of the array of sub-ADCs is set or determined to be sampled at times (0+0.1)t, (2+0.1)t, (4+0.1)t, (6+0.1)t, (8+0.1)t, (10+0.1)t, (18+0.1)t, (20+0.1)t, (22+0.1)t, and so on, the calibration component 120 can select the auxiliary sampling rate (e.g., every 5t), and can align (e.g., via an adjustment(s)) the sampling times (e.g., (0+0.1)t, (10+0.1)t, (20+0.1)t, and so on) associated with the auxiliary sub-ADC 122 with the sampling time associated with that sub-ADC, to enable the sampling of the auxiliary signal associated with the auxiliary path of the auxiliary sub-ADC 122 to occur at the same or at least substantially the same time as a subset of the sampling times (e.g., (0+0.1)t, (10+0.1)t, (20+0.1)t, and so on) associated with that sub-ADC that occur at the sample time instants that the auxiliary samples occur.

With further regard to FIG. 1, once the calibration component 120 determines that the auxiliary sub-ADC 122 (and associated auxiliary path) is desirably (e.g., optimally, suitably, acceptably) aligned with a sub-ADC (e.g., 108, 110, or 112), the alignment of the auxiliary sub-ADC 122 and associated auxiliary path can be completed, and the auxiliary sub-ADC 122 and auxiliary path are ready to be used to facilitate calibrating the sub-ADCs (e.g., 108, 110, 112, etc.) of the array. With the aligning of the auxiliary sub-ADC 122 with a sub-ADC (e.g., 108, 110, or 112) of the array and the arrangement of the sampling of the auxiliary path in relation to the sampling of the other paths associated with the sub-ADC array, the calibration component 120 can thereby determine calibrations or adjustments that can be made to the other sub-ADCs (e.g., 108, 110, 112, etc.), and can calibrate or adjust the other sub-ADCs accordingly, because it is known that the sampling clock of the auxiliary path passes through all the sampling points of the other sub-ADCs. The auxiliary sub-ADC 122 can operate on a clock (e.g., auxiliary clock) that can be separate from, and can operate at a different frequency than, the clock used by the sub-ADCs (e.g., 108, 110, 112, etc.) in the array. Since the auxiliary sub-ADC 122 is a single, separate sub-ADC, it can be known that there is no timing skew associated with the auxiliary sub-ADC 122 because it uses only one clock (e.g., the auxiliary clock), so there is no different clock that can affect the auxiliary sub-ADC 122. As a result, the calibration component 120 can use information (e.g., auxiliary-signal-sample-related information) relating to the auxiliary sub-ADC and associated auxiliary path to compare against information (e.g., signal-sample-related information) relating to the sub-ADCs (e.g., 108, 110, 112, etc.) in the array.

The calibration component 120 can provide a reliable metric for detecting sampling path differences between signal paths associated with the sub-ADCs (e.g., 108, 110, 112, etc.) of the array under a wide range of conditions. For instance, to eliminate any assumptions or knowledge of the signal received by the receiver component (not shown) of the transceiver component 102, the calibration component 120 can determine (e.g., calculate) or extract the path difference information between paths of the array of sub-ADCs (e.g., 108, 110, 112, etc.) by computing a squared difference error between the auxiliary samples of the auxiliary sub-ADC 122 and the respective corresponding samples of the other sub-ADCs (e.g., 108, 110, 112, etc.) of the array, as more fully disclosed herein. In some implementations, the calibration component 120 can determine an average of the squared difference error over a desired number of auxiliary samples of the auxiliary sub-ADC 122 and the respective corresponding samples of the other sub-ADCs (e.g., 108, 110, 112, etc.), and can use the average (or median or trend) of the squared difference error to determine or extract the path difference information between paths of the array of sub-ADCs to facilitate improving the estimation accuracy of the path differences between paths of the sub-ADCs (e.g., 108, 110, 112, etc.) of the array. This can allow for accurate (e.g., exact or substantially exact) computation of the path difference between paths of the sub-ADCs (e.g., 108, 110, 112, etc.) of the array without having to make any underlying assumption of the input statistics of the receiver component.

For example, with regard to the disclosed subject matter of the system 100, there is no need for assumptions or information about the statistical properties of the signals, such as stationary properties, bandwidth occupancy or symbol rate, oscillator frequencies, jitter spectrum, or any changes in such characteristics, in connection with the sub-ADCs (e.g., 108, 110, 112, etc.) of the array in order for the calibration component 120 to desirably determine the path differences between the paths associated with the sub-ADCs of the array, determine calibrations (e.g., adjustments) to be made to the sub-ADCs of the array to reduce or minimize such path differences, and perform such calibrations with respect to the sub-ADCs. Similarly, the calibration component 120 can determine and perform calibrations for the sub-ADCs (e.g., 108, 110, 112, etc.), without the need of knowledge of the characteristics of the signal itself, such as whether the signal is a broadband or narrowband signal, whether the signal is random data, pseudo-random data, multitone data, etc., or any relation between the received signal and the received sampling array.

In some implementations, the calibration component 120 also can perform calibrations for the sub-ADCs (e.g., 108, 110, 112, etc.) of the array to carry out timing skew estimation for the sub-ADCs. For instance, the auxiliary sub-ADC 122 can be configured to operate at a higher speed than the other sub-ADCs (e.g., 108, 110, 112, etc.) in the array to facilitate minimizing bandwidth mismatches among the sub-ADCs (e.g., 108, 110, 112, etc.). At lower rates, the matching requirements for the sub-ADCs (e.g., 108, 110, 112, etc.) can be relaxed. The calibration component 120 can calibrate the sampler path so that is can provide reliable information that can be used by the calibration component 120 to correct or adjust the timing skew associated with the path. In some implementations, the calibration component 120 can program or configure the phase interpolator component 128 for the auxiliary path and the analog delay lines for the sampler paths of the sub-ADCs (e.g., 108, 110, 112, etc.) using an the defined alignment algorithm (e.g., initial calibration algorithm) that can facilitate aligning the auxiliary path to one of the data-path samplers (e.g., one of the sub-ADCs). The calibration component 120 also can control the bandwidth/frequency response of the auxiliary path.

In certain implementations, the calibration component 120 can employ an analog delay line to facilitate correcting the timing skew between paths or correcting other path differences between paths associated with the array of sub-ADCs (e.g., 108, 110, 112, etc.). For example, the calibration component 120 can determine an analog delay line that can be applied to a sub-ADC path to adjust the timing (e.g., sampling timing) of the sub-ADC path in relation to another sub-ADC path or the auxiliary path to facilitate correcting, reducing, or minimizing a timing skew between the sub-ADC path in relation to the other sub-ADC path or auxiliary path that was detected by the calibration component 120.

As another example, additionally and/or alternatively, to facilitate correcting the timing skew between paths or correcting other path differences between paths associated with the array of sub-ADCs (e.g., 108, 110, 112, etc.), the calibration component 120 can employ the filter component 126 (e.g., which can be controlled by the calibration component 120) that can be operating on the samples from all or desired sub-ADCs (e.g., 108, 110, 112, etc.) of the array prior to combining the data stream, wherein the filter component 126 can be designed or set based at least in part on the difference error metric (e.g., squared difference error, or average (or median or trend) squared difference error) determined or extracted by the calibration component 120, as disclosed herein.

The filter component 126 can employ an analog filter that can be applied to one or more analog signals associated with one or more of the sub-ADC paths prior to those signals being converted to digital signals by the sub-ADCs (e.g., 108, 110, 112, etc.) and/or can employ a digital filter that can be applied to one or more digital signals (e.g., one or more digital substreams) associated with one or more of the sub-ADC paths after the analog signals have been converted to the digital signals by the sub-ADCs (e.g., 108, 110, 112, etc.). The calibration component 120 can facilitate determining filter parameters, filter configuration, type (e.g., analog and/or digital) of filter, and/or other features of the filter(s) to be employed by the filter component 126 to generate the desired filter(s) to be applied to the signals to facilitate mitigating path differences between sub-ADC paths.

In some instances, for a variety of reasons (e.g., drift, integral nonlinearity (INL) issues, differential nonlinearity (DNL) issues, or other issues), it can be desirable to employ a hybrid approach comprising an analog filter and/or analog delay line as well as a digital filter to facilitate mitigating a path difference error for a sub-ADC array. For example, an analog filter and/or analog delay line may be able to correct 90% of a path difference error, but not the remaining 10% of the error, wherein, for a high-performance system, it may be desirable to achieve 100% or almost 100% correction of the error. The calibration component 120 can facilitate controlling the filter component 126 to produce a digital filter that can be applied to the digital signal of the path to correct all or almost all of the remaining 10% error.

In other implementations, the calibration component 120 can use information relating to the auxiliary samples from the auxiliary sub-ADC 122 and samples from the other sub-ADCs (e.g., 108, 110, 112, etc.) of the array to determine a transfer function difference between the paths associated with the sub-ADCs (e.g., 108, 110, 112, etc.) of the array. The calibration component 120 can correct (e.g., reduce, minimize, eliminate) the transfer function difference (e.g., transfer function error) between the paths associated with the sub-ADCs using one or more desired digital or analog techniques (e.g., analog delay line, analog filter, digital filter, iterative or adaptive techniques), as disclosed herein.

In still other implementations, the calibration component 120 (or another component associated with the system 100) can frequency lock the sampling clock (not shown in FIG. 1) used for the auxiliary sub-ADC 122 to the sampling clock (not shown in FIG. 1) associated with (e.g., used by) the other sub-ADCs (e.g., 108, 110, 112, etc.) of the array, while having a significantly higher jitter than the jitter of the sampling clock associated with the other sub-ADCs (e.g., 108, 110, 112, etc.). The sampling clock associated with the auxiliary sub-ADC 122 and/or the sampling clock associated with the other sub-ADCs (e.g., 108, 110, 112, etc.) can sometimes have a small deviation or error such that the sampling of a signal on a path can occur at a slightly different time than the desired (e.g., nominal or scheduled) time (e.g., occurs at time $(5+0.1)t$ instead of at time $5t$), but still can, on average, sample the signal on the path at or practically at the desired time. With regard to the sampling clock associated with the auxiliary sub-ADC, if the sampling time deviation is minimal, such that, on average, it falls within a jitter average wherein the calibration component 120 is still able to desirably (e.g., accurately or substantially accurately, acceptably, optimally) determine the timing skew (e.g., the average timing skew over a defined time period) between sub-ADC paths, the jitter associated with the sampling clock associated with the auxiliary sub-ADC 122 can be relaxed to allow sampling time deviations by that sampling clock to the extent that the calibration component 120 is still able to desirably determine such timing skews, in accordance with a defined calibration criteria.

In yet other implementations, based at least in part on the results of the analysis of the sample-related information, the calibration component 120 can determine a timing offset for the sub-ADCs (e.g., 108, 110, 112, etc.) of the array that can reduce or minimize their squared difference error metric with respect to the auxiliary sub-ADC 122. The calibration component 120 can adjust one or more of the sub-ADC paths associated with the sub-ADCs (e.g., 108, 110, 112, etc.) by the timing offset to reduce or minimize the squared difference error metric of the sub-ADCs (e.g., 108, 110, 112, etc.) with respect to the auxiliary sub-ADC 122. In this way, it can be known that all of the sub-ADC path delays are equalized without the calibration component 120 (or other component) having to perform additional computations.

Also, based at least in part on the results of the analysis of the sample-related information, the calibration component 120 can determine the estimated path differences of each sub-ADC (e.g., 108, 110, 112, etc.) of the array. The calibration component 120 can use the estimated path differences to, for example, configure a correction filter, such as a sub-ADC path correction digital filter or analog filter, for the filter component 126 that can process all or desired sub-ADC signals to equalize or at least substantially equalize path differences between the paths of the sub-ADCs (e.g., 108, 110, 112, etc.) to reduce or minimize path difference errors between sub-ADC paths. In accordance with various implementations, the calibration component 120 can configure the sub-ADC path correction digital filter using iterative and/or adaptive techniques (e.g., least-mean-square (LMS) or recursive least squares (RLS) techniques or processes relating to channel estimation, path differences, and/or filtering) or using direct computation. For instance, the calibration component 120 and/or filter component 126 can employ an iterative or adaptive engine or function (e.g., an LMS engine or function) that can generate or synthesize a desired filter that can produce a desired filtered output (e.g., filtered signal) in response an input (e.g., input signal). In other implementations, with regard to the analog correction filter, the calibration component 120 can control the analog correction filter, based at least in part on the estimated sub-ADC channels of the sub-ADCs (e.g., 108, 110, 112, etc.), to facilitate desirably filtering all or desired sub-ADC signals to equalize or at least substantially equalize path differences between the paths of the sub-ADCs (e.g., 108, 110, 112, etc.).

The respective sub-ADCs (e.g., 108, 110, 112, etc.) of the array, as calibrated by the calibration component 120, can facilitate providing respective digital data substreams, which can correspond to the received signal (e.g., analog signal), as an output. The combiner component 116 can receive the respective digital data substreams and can combine, integrate, or deinterleave the respective digital data substreams of the respective sub-ADCs (e.g., 108, 110, 112, etc.) to generate, at a desirably high speed, a digital data stream that can desirably (e.g., accurately or substantially accurately, optimally, acceptably) represent the data contained in the analog signal that was received by the transceiver component 102, wherein the digital data stream can be free or at least substantially and suitably free of distortion.

Figure 5:
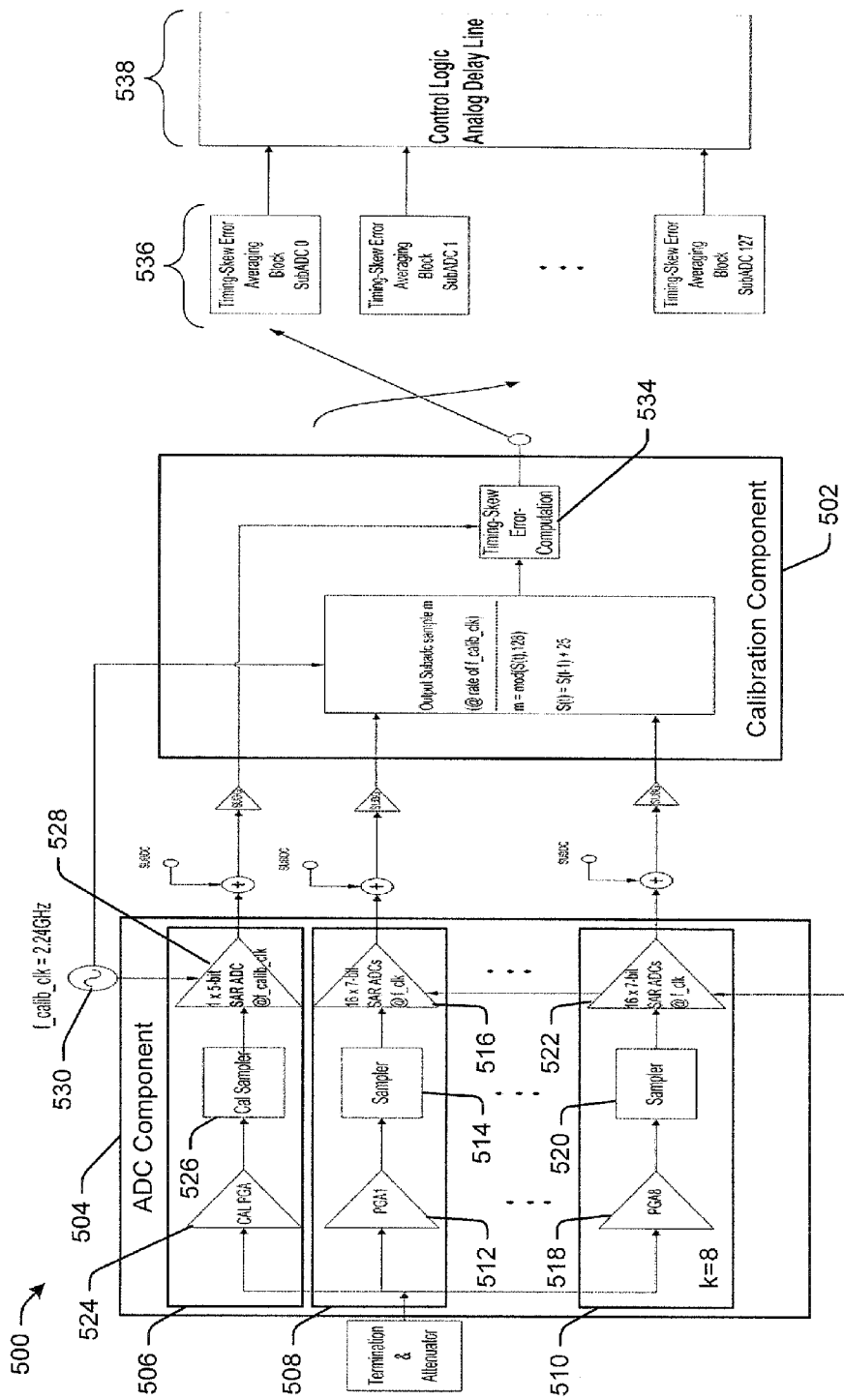
FIG. 5 depicts a diagram of an example, non-limiting embodiment of a system that can facilitate calibrating sub-ADCs of an array of sub-ADCs of a transceiver component to facilitate correcting or mitigating sub-ADC path differences, in accordance with various aspects and embodiments of the disclosed subject matter.

Referring to FIG. 5 (along with FIG. 1), FIG. 5 depicts a diagram of an example, non-limiting embodiment of a system 500 that can facilitate calibrating sub-ADCs of an array of sub-ADCs of a transceiver component to facilitate correcting or mitigating sub-ADC path differences, in accordance with various aspects and embodiments of the disclosed subject matter. The system 500 can illustrate various aspects and features of disclosed subject matter, including aspects and features relating to the defined calibration algorithm.

The system 500 can comprise a calibration component 502, and an ADC component 504, comprising an auxiliary sub-ADC 506 and a set of sub-ADCs (e.g., an array of k sub-ADCs), comprising sub-$ADC_1$ 508 up through sub-$ADC_k$ 510, wherein k can equal 8 in this non-limiting example embodiment. The calibration component 502, ADC component 504, auxiliary sub-ADC 506 and set of sub-ADCs can be the same as or similar to, and/or can comprise the same or similar functionality as, respective components (e.g., respectively named components), as more fully described herein.

Each of the sub-ADCs (e.g., 508, 510, etc.) of the set of sub-ADCs can comprise a PGA, a sampler component (sampler), and a converter component (e.g., an ADC, such as a successive approximation register (SAR) ADC), among other components or features. For instance, the sub-$ADC_1$ 508 can comprise $PGA_1$ 512, sampler component$_1$ 514, and converter component$_1$ 516, and sub-$ADC_k$ 510 can comprise $PGA_k$ 518, sampler component$_k$ 520, and converter component$_k$ 522. The auxiliary sub-ADC 506 can be designed to closely (e.g., substantially) match the processing paths of the other sub-ADCs (e.g., sub-$ADC_1$ 508 up through sub-$ADC_k$ 510) of the array. For instance, the auxiliary sub-ADC 506 can comprise a calibration PGA 524 (CAL PGA), a calibration sampler component 526 (Cal Sampler), and a calibration converter component 528 (SAR ADC), wherein the calibration PGA 524, calibration sampler component 526, and calibration converter component 528 can be the same as or similar to the corresponding components of the sub-ADCs (e.g., sub-$ADC_1$ 508 up through sub-$ADC_k$ 510). The sub-ADCs (e.g., sub-$ADC_1$ 508 up through sub-$ADC_k$ 510) and auxiliary sub-ADC 506 also can be closely matched to each other with regard to other components (e.g., buffers) and features (e.g., bandwidth) that can be part of the respective paths of the sub-ADCs (e.g., sub-$ADC_1$ 508 up through sub-$ADC_k$ 510) and auxiliary sub-ADC 506.

The respective PGAs (e.g., 512, 518, 524) can be employed in the respective paths of the auxiliary sub-ADC 506 and sub-ADCs 508 and 510 to provide signal gain (e.g., by amplifying lower-amplitude signals) to the respective paths and improve (e.g., increase) the dynamic range of the respective paths prior to the respective signals being provided to the respective converter components (e.g., 516, 522, 528). The respective sampler components (e.g., 514, 520, 526) can perform the sampling of the respective analog signals on the respective paths, in accordance with a desired sampling frequency, to facilitate the analog-to-digital conversion of the respective analog signals to corresponding digital signals (e.g., digital samples). The respective converter components (e.g., 516, 522, 528) can convert the respective analog samples to corresponding digital samples, in accordance with the respective sampling frequencies associated with the respective converter components (e.g., 516, 522, 528), based at least in part on the respective clocks (e.g., calibration clock 530 (f_calib_clk) and clock 532 (f_clk)) associated with the respective converter components (e.g., 516, 522, 528).

The calibration clock 530 can operate at a different (e.g., higher) frequency (e.g., 2.24 GHz, as depicted in FIG. 5) than the frequency (e.g., 437.5 MHz, as depicted in FIG. 5) at which the clock 532 operates to facilitate enabling the auxiliary sub-ADC 506 to have a different (e.g., lower) sampling timing than the sampling timing associated with the other sub-ADCs (e.g., sub-ADC$_1$ 508 up through sub-ADC$_k$ 510) of the ADC component 504. This can enable the auxiliary sub-ADC 506 to have a sampling time (e.g., auxiliary sampling time) on the auxiliary path that can have a different rate than that of the other sub-ADCs (e.g., sub-ADC$_1$ 508 up through sub-ADC$_k$ 510) to enable the auxiliary sub-ADC 506 to pass through the sampling times of all of the desired samples for all sub-ADCs (e.g., sub-ADC$_1$ 508 up through sub-ADC$_k$ 510) of the sub-ADC array and to reduce power consumption associated with the auxiliary path, as more fully disclosed herein.

While the components of the auxiliary sub-ADC 506 can closely match the corresponding components of the other sub-ADCs (e.g., sub-ADC$_1$ 508 up through sub-ADC$_k$ 510), not every component of the auxiliary sub-ADC 506 has to be identical to the corresponding component of the other sub-ADCs. For example, the calibration converter component 528 can be similar to, but different from, the converter components (e.g., 516, 522) of the other sub-ADCs, since the calibration converter component 528 is not converting data from the received analog signals, but rather is being used to facilitate calibrating the other sub-ADCs (e.g., sub-ADC$_1$ 508 up through sub-ADC$_k$ 510), and since it can be desirable to, for example, reduce power consumption associated with the auxiliary path, reduce area used by the auxiliary path, and/or reduce costs associated with the auxiliary path and its components. For instance, as depicted in the system 500 of FIG. 5, while the converter components (e.g., 516, 522) of the other sub-ADCs each can comprise 16×7-bit ADC converters, the calibration converter component 528 of the auxiliary sub-ADC 506 can comprise a 1×5-bit ADC converter.

The calibration component 502 can analyze the auxiliary signals (e.g., auxiliary samples) and respective signals (e.g., samples) of the sub-ADCs (e.g., sub-ADC$_1$ 508 up through sub-ADC$_k$ 510) and can determine path differences (e.g., timing skew errors, bandwidth differences, and/or other types of path differences) between the respective paths of the auxiliary sub-ADC 506 and the sub-ADCs (e.g., sub-ADC$_1$ 508 up through sub-ADC$_k$ 510), as more fully disclosed herein. The calibration component 502 can determine calibrations or adjustments that can be made or applied to the auxiliary sub-ADC 506, and/or the auxiliary signal on the auxiliary path, and the sub-ADCs (e.g., sub-ADC$_1$ 508 up through sub-ADC$_k$ 510), and/or the respective signals on the respective sub-ADC paths, to correct or mitigate the path differences, based at least in part on the analysis results, as more fully disclosed herein. For instance, as depicted in FIG. 5, the system 500 illustrates the calibration component 502 determining (e.g., computing) timing skew errors between the respective paths (at reference numeral 534, determining or generating respective timing-skew averaging blocks (at reference numeral 536), and applying or providing those respective timing-skew averaging blocks to control logic and an analog delay line(s) (at reference numeral 538) to facilitate determining calibrations and adjustments to be applied to the respective sub-ADCs (e.g., 506, 508, 510, etc.) and/or respective paths using analog and/or digital techniques (e.g., analog delay lines, analog and/or digital filtering, etc.) to correct or mitigate the path differences, as more fully disclosed herein. The calibration component 502 can apply such calibrations or adjustments to the respective sub-ADCs (e.g., 506, 508, 510, etc.) and/or respective paths using the analog and/or digital techniques to correct or mitigate the path differences, as more fully disclosed herein.

Figure 6:
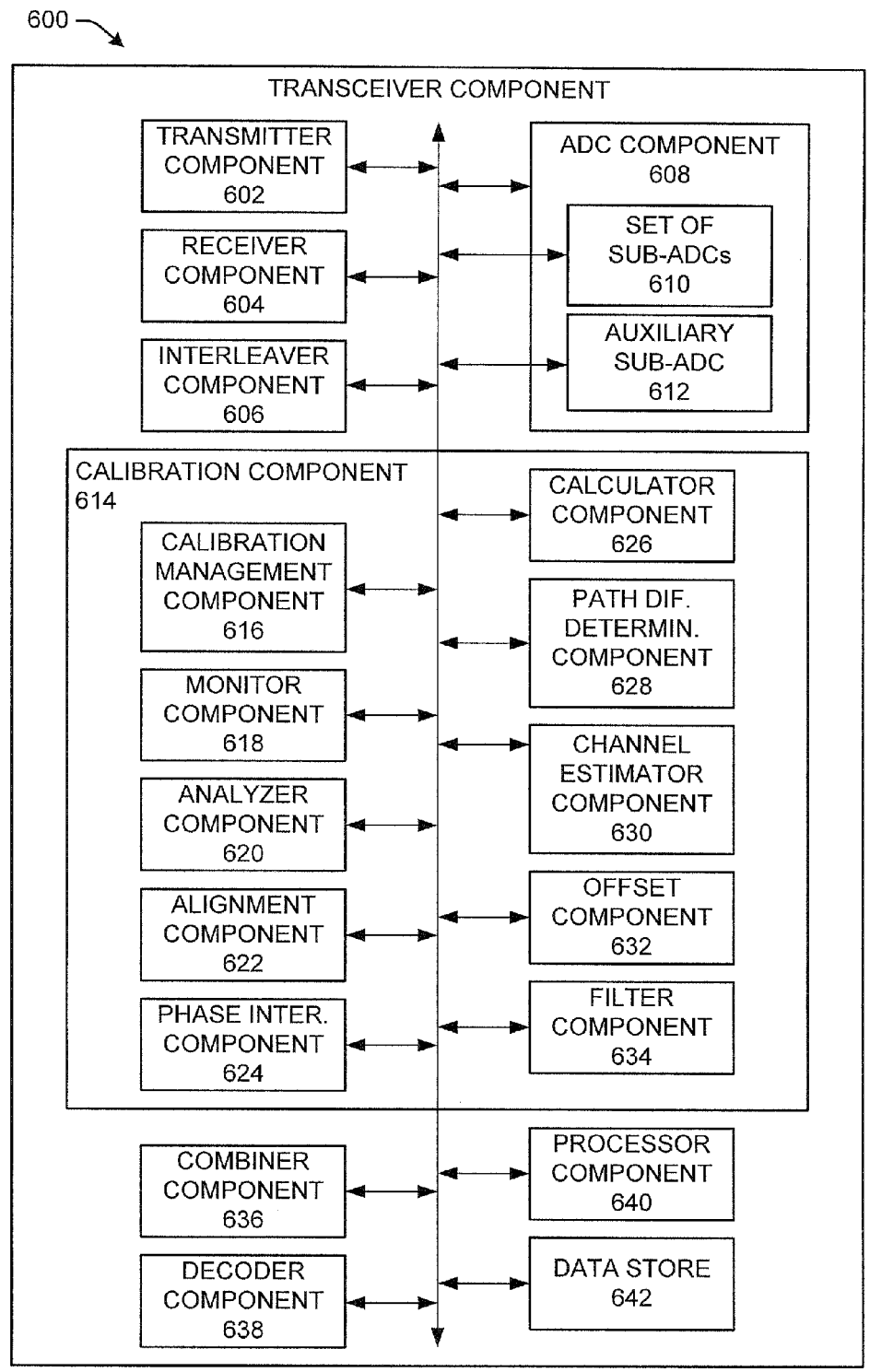
FIG. 6 illustrates a block diagram of an example, non-limiting embodiment of a transceiver component, in accordance with various aspects and embodiments of the disclosed subject matter.

FIG. 6 illustrates a block diagram of an example, non-limiting embodiment of a transceiver component 600, in accordance with various aspects and embodiments of the disclosed subject matter. The transceiver component 600 can be used to transmit or receive voice or data communications. In some implementations, the transceiver component 600 can be a full-duplex transceiver The transceiver component 600 can comprise a transmitter component 602 that can comprise one or more transmitter sub-components (e.g., transmitters) that can facilitate transmitting voice information or data from the transceiver component 600 to a communication device that is communicatively connected to the transceiver component 600 via a wireline, optical, or wireless communication connection (e.g., communication channel). In some implementations, the transmitter component 602 can include, for example, a set (e.g., 2, 3, 4, . . . ) of transmitter sub-components.

The transceiver component 600 also can comprise a receiver component 604 that can comprise one or more receiver sub-components (e.g., receivers) that can facilitate receiving voice information or data from a communication device that is communicatively connected to the transceiver component 600 via a wireline, optical, or wireless communication connection (e.g., communication channel). In some implementations, the receiver component 604 can include, for example, a set (e.g., 2, 3, 4, . . . ) of receiver sub-components.

The transceiver component 600 also can comprise an interleaver component 606 that can be employed to interleave a received analog signal across the respective interleaved sub-ADCs of a sub-ADC array of the ADC component 608. In some implementations, the interleaver component 606 (or the calibration component 614) can process the analog signal to implement or introduce respective time delays to the analog signal to generate time-delayed analog signals (e.g., having respective time delays) prior to the signal being input to the ADC component 608.

The transceiver component 600 can include an ADC component 608 that can comprise a set of sub-ADCs 610 that can be arranged or configured in an interleaved structure to facilitate converting analog signals to digital signals, as more fully disclosed herein. The respective sub-ADCs of the set 610 of the ADC component 608 can receive respective analog signals (e.g., respectively time-delayed analog signals) in connection with an analog signal received from a remote communication device, can sample (e.g., using a sample component(s)) the respective analog signals, and can convert or digitize (e.g., via a converter or digitizer component(s)) the respective analog signals to respective digital data samples that can have digital values that can correspond to the respective analog signals (e.g., can correspond to the analog values of the analog signal samples).

The ADC component 608 also can comprise an auxiliary sub-ADC 612 associated with an auxiliary path, wherein the auxiliary path can closely match the sub-ADCs paths of the sub-ADCs 610. The auxiliary sub-ADC 612 and associated auxiliary path can process an auxiliary signal, including sampling and converting an analog auxiliary signal to digital auxiliary signal (e.g., sample), for use by the calibration component 614 to facilitate determining path differences between the paths of the respective sub-ADCs (e.g., the auxiliary sub-ADC 612 and the respective sub-ADCs of the set 610).

The calibration component 614 can analyze the auxiliary signal on the auxiliary path associated with the auxiliary sub-ADC 612 and the respective signals on the respective paths of the respective sub-ADCs 610 to facilitate determining and applying calibrations or adjustments that can be made or applied to the respective sub-ADCs of the set 610 and/or their respective sub-ADC paths (and/or respective signals) to correct or mitigate path differences (e.g., path difference errors) between the respective paths of the respective sub-ADCs. This can facilitate mitigating distortions that would otherwise have been caused as a result of the uncorrected or unmitigated path differences. In accordance with various aspects and implementations, the calibration component 614 can comprise, for example, a calibration management component 616, a monitor component 618, an analyzer component 620, an alignment component 622, a phase interpolator component 624 (PHASE INTER. COMPONENT), a calculator component 626, a path difference determination component 628 (PATH DIF. DETERMIN. COMPONENT), a channel estimator component 630, an offset component 632, and a filter component 634.

The calibration management component 616 can control or manage operations of the various components (e.g., monitor component 618, analyzer component 620, an alignment component 622, etc.) of the calibration management component 616, data flow between the various components of the calibration management component 616, data between the calibration management component 616 and other components (e.g., the ADC component 608, the combiner component 636, the processor component 640, the data store 642, etc.), and/or other operations of or associated with the calibration management component 616. Employing the various components of the calibration management component 616, the calibration management component 616 also can respectively calibrate or adjust the respective sub-ADCs of the ADC component 608 and/or information or paths (e.g., sub-ADC paths) associated with the respective sub-ADCs to facilitate correcting or mitigating the respective sub-ADC path differences between paths (e.g., correcting, mitigating, equalizing or substantially equalizing path differences between the sub-ADC paths) associated with the respective sub-ADCs, as more fully disclosed herein.

The monitor component 618 can monitor, sense, or detect information, such as information relating to auxiliary samples on the auxiliary path, samples on the respective sub-ADC paths, path differences between paths, communication conditions, information relating to transfer characteristics, etc., associated with the transceiver component 600. For instance, the monitor component 618 can monitor, sense, or detect information relating to auxiliary samples on the auxiliary path and samples on the respective sub-ADC paths, wherein such information can facilitate determining path differences between paths of the respective sub-ADCs of the ADC component 608.

The analyzer component 620 can analyze, evaluate, or compare data associated with the transceiver component 600 to facilitate calibrating or adjusting the respective sub-ADCs of the ADC component 308 and/or information or paths (e.g., sub-ADC paths) associated with the respective sub-ADCs to facilitate correcting or mitigating the respective sub-ADC path differences (e.g., equalizing or substantially equalizing the respective sub-ADC paths) associated with the respective sub-ADCs. The data that can be analyzed by the analyzer component 620 can relate to, for example, analog or digital samples associated with the respective sub-ADCs of the set 610, digital samples associated with the auxiliary sub-ADC 612, recovered data (e.g., digital data) associated with (e.g., obtained from) a received analog signal, various types of transfer characteristics that can be associated with the respective sub-ADCs, information relating to channel estimation or channel responses, information resulting from calculations performed by the calculator component 626, information relating to respective transfer functions associated with respective sub-ADCs, information relating to respective path differences between respective sub-ADCs, and/or other information relating to calibration of the sub-ADCs. Based at least in part on the data analysis, the analyzer component 620 can generate analysis results that can be used by the calibration management component 616 to facilitate making determinations relating to calibration or adjustment of the respective sub-ADCs of the ADC component 608 and/or information or paths associated with the respective sub-ADCs to facilitate correcting or mitigating the respective sub-ADC path differences between paths associated with the respective sub-ADCs.

The alignment component 622 can align or calibrate (e.g., initially align or calibrate, re-align or re-calibrate) the auxiliary sub-ADC 612 with or to a sub-ADC of the set 610, in accordance with a defined alignment algorithm, as disclosed herein. In some implementations, the calibration component 614 can comprise or be associated with the phase interpolator component 624, which can be associated with the auxiliary sub-ADC 612 to facilitate adjusting a phase or time difference between the auxiliary sub-ADC 612 and the sub-ADCs of the set 610 to facilitate aligning or calibrating the auxiliary sub-ADC 612 with or to a sub-ADC of the set 610.

For instance, the phase interpolator component 624 can enable the auxiliary sub-ADC 612 to be lined up to any one of the sampling instants of a sub-ADC of the set 610. The alignment component 622 also can employ analog delay lines that can be applied to the auxiliary path (and associated auxiliary signal) associated with the auxiliary sub-ADC 612 or a path (and associated signal) associated with a sub-ADC of the set 610 to facilitate delaying an auxiliary signal or signal, respectively, to facilitate aligning or calibrating the auxiliary sub-ADC 612 with or to the sub-ADC. An auxiliary path sampling rate, a phase interpolator of the phase interpolator component 624, and analog delay lines can be suitably designed or controlled (e.g., by the alignment component 622 and/or the calibration management component 616) to facilitate establishing an initial match (or at least substantial match) between sampling instants of the auxiliary sub-ADC 612 and a sub-ADC of the set 610.

In some implementations, the alignment component 622 and/or the calibration management component 616 can control the phase interpolator component 624 to adjust the phase of the auxiliary sub-ADC 612 in connection with the auxiliary path and/or can facilitate adjusting or selecting an analog delay line that can be applied to the auxiliary path (and associated auxiliary signal) to facilitate performing an alignment (e.g., initial alignment) of the auxiliary sub-ADC 612 and auxiliary path with a sub-ADC of the set 610 and the associated sub-ADC path. For each phase interpolator delay and analog delay line delay, the alignment component 622 can examine (e.g., analyze, evaluate) the samples of all of the sub-ADCs of the set 610 for each one of their analog delay lines or paths to determine whether the auxiliary sub-ADC 612 is aligned with a sub-ADC of the set 610. When alignment of the auxiliary sub-ADC 612 is determined to be achieved, the alignment component 622 can end the alignment process and can transmit an alignment indicator to the calibration management component 616, wherein the alignment indicator can indicate that the desired alignment of the auxiliary sub-ADC 612 with a sub-ADC of the set 610 has been achieved.

The calculator component 626 can perform calculations (e.g., mathematical calculations) on data values using equations, including the equations disclosed herein, and/or matrices, to generate calculation results. For example, the calculator component 626 can calculate the squared difference error or average (or median or trend) squared difference error between an auxiliary sample (or average, median, or trend value of auxiliary samples) for the auxiliary sub-ADC 612 and a corresponding sample (or average, median, or trend value of corresponding samples) associated with a sub-ADC of the set 610. The calibration management component 616 can use the calculation results to facilitate calibrating or adjusting the respective sub-ADCs of the ADC component 608 and/or information or paths (e.g., sub-ADC paths) associated with the respective arrays to facilitate correcting or mitigating the respective sub-ADC path differences associated with the respective sub-ADCs of the set 610.

The path difference determination component 628 can be employed to determine differences between the respective paths of the sub-ADCs of the set 610 as well as between the auxiliary path of the auxiliary sub-ADC 612 and the paths of the sub-ADCs of the set 610, based at least in part on analysis results from the analyzer component 620, calculation results (e.g., squared difference error results or other results) from the calculator component 626, or other information, as more fully disclosed herein. For example, the path difference determination component 628 can determine differences between the respective paths of the sub-ADCs of the set 610 and/or between the auxiliary path of the auxiliary sub-ADC 612 and the paths of the sub-ADCs of the set 610, based at least in part on the results (e.g., analysis or calculation results) relating to the comparison of the auxiliary signal associated with the auxiliary sub-ADC 612 and the respective signals associated with the respective sub-ADCs of the set 610.

The channel estimator component 630 can perform channel estimations or determinations to facilitate determining respective transfer functions associated with, and/or a transfer function difference between, the respective paths of the respective sub-ADCs of the ADC component 608, for example, using a desired channel estimation technique. The channel estimator component 630 can employ any of a number of channel estimation techniques to facilitate determining such transfer functions. For example, the channel estimator component 630 can use a least-squares channel estimation technique, a data cross-correlation technique, an iterative channel estimation technique (e.g., LMS channel estimation, RLS channel estimation, blind channel estimation, etc.), or another desired channel estimation technique, to facilitate determining such transfer functions or transfer function differences.

The offset component 632 can be used by the calibration management component 616, for example, to facilitate adjusting an offset(s), such as a timing offset(s), associated with a sub-ADC path(s) to facilitate reducing or minimizing a path difference(s) (e.g., based on a squared difference error metric) between the respective paths of the respective sub-ADCs of the set 610 and/or between the paths of the sub-ADCs of the set 610 and the auxiliary path associated with the auxiliary sub-ADC 612. For example, based at least in part on the results of the analysis of the sample-related information, the calibration management component 616 or offset component 632 can determine a timing offset that can be applied to a sub-ADC(s) of a sub-ADC array that can reduce or minimize a squared difference error metric associated with the sub-ADC(s) with respect to the auxiliary sub-ADC 612. The calibration management component 616 or offset component 632 can adjust one or more of the sub-ADC paths associated with one or more of the sub-ADCs of the ADC component 608 by the timing offset(s) to reduce or minimize the squared difference error metric determined with respect to the paths of the sub-ADCs with respect to the auxiliary sub-ADC 122. In this way, it can be known that all of the sub-ADC path delays are equalized without the calibration component 120 (or other component) having to perform additional computations.

In some implementations, the offset component 632 can be employed to implement or introduce one or more timing offsets to facilitate measuring, determining, or estimating respective channel responses (e.g., by the channel estimator component 630) of respective sub-ADC paths at the one or more offsets, and/or to facilitate correcting or mitigating path differences between sub-ADCs of the set 610. In other implementations, the offset component 632 can be used by the calibration management component 616 to facilitate adjusting a timing offset(s) associated with a sub-ADC path(s) to facilitate adjusting respective transfer functions of respective sub-ADCs of the set 610 until the respective transfer functions of the respective sub-ADCs are the same or at least substantially the same.

The filter component 634 can comprise one or more analog or digital filters that can filter or process information, such as analog signals (e.g., analog data samples) or digital signals (e.g., digital data samples), to facilitate correcting, mitigating, or equalizing (or at least substantially equalizing) sub-ADC path differences between respective paths of the sub-ADCs of the ADC component 608. The filter component 634 can facilitate configuring a filter(s) (e.g., an analog correction filter or a digital correction filter) based at least in part on information relating to estimated or determined channel responses of each ADC sub-component of the ADC component 608. The filter component 634 can use the configured filter(s) to facilitate processing (e.g., filtering) respective sub-ADC signals of the respective sub-ADCs to facilitate correcting, mitigating, or equalizing path differences between the respective sub-ADCs of the ADC component 608. In accordance with implementations, the filter component 634 can configure a filter (e.g., a sub-ADC path correction digital filter) using iterative or adaptive techniques (e.g., LMS or RLS techniques), or using direct computation (e.g., as facilitated by the calculator component 626). In certain implementations, the filter component 634 can employ a correction filter that can be an analog filter, wherein the calibration management component 616 can facilitate controlling or configuring the analog correction filter, based at least in part on the information of the estimated or determined channel responses of the respective ADC sub-components, to facilitate processing the respective sub-ADC signals to facilitate equalizing or at least substantially equalizing path differences between the respective ADC sub-components of the ADC component 608.

The transceiver component 600 also can comprise a combiner component 636 that can combine, integrate, or deinterleave the respective digital data substreams of the respective sub-ADCs of the ADC component 608 to generate a digital data stream that can accurately represent the data contained in the received analog signal, as more fully disclosed herein. The combiner component 636 can be associated with (e.g., communicatively connected to) the ADC component 608 to facilitate receiving the digital data substreams from the sub-ADCs of the ADC component 608. The combiner component 636 also can be associated with the calibration component 614 to facilitate providing the respective digital data substreams (e.g., respective digital data samples) to the calibration component 614 for analysis by the calibration component 614 to facilitate calibrating or adjusting the respective subs-ADCs of the ADC component 608 and/or information or paths associated with the respective sub-ADCs to facilitate correcting or mitigating the respective sub-ADC path differences (e.g., equalizing or substantially equalizing the respective sub-ADC paths) associated with the respective sub-ADCs of the ADC component 608.

The transceiver component 600 also can comprise a decoder component 638 that can decode and/or error correct the digital data stream, comprising the combined or integrated digital data samples of digital data substreams output from the sub-ADCs of the ADC component 608, to facilitate determining or recovering the data (e.g., determining the data values of data) that was sent in the analog signal to the transceiver component 600, in accordance with a desired decoding and/or error correction techniques. The decoder component 638 can employ, for example, a Reed-Solomon algorithm, a Hamming code, a Bose, Ray-Chaudhuri, Hocquenghem (BCH) algorithm, a forward error correction (FEC) algorithm, or other decoding algorithm or error correction algorithm, etc., to facilitate decoding and/or correcting errors associated with the respective digital data samples of the digital data substreams to facilitate determining or recovering the data of the analog signal.

The transceiver component 600 also can comprise a processor component 640 that can operate in conjunction with the other components (e.g., transmitter component 602, receiver component 604, interleaver component 606, ADC component 608, calibration component 614, etc.) to facilitate performing the various functions of the transceiver component 600, such as disclosed herein. The processor component 640 can employ one or more processors (e.g., central processing units (CPUs), graphical processing units (GPUs), field-programmable gate arrays (FPGAs), etc.), microprocessors, or controllers that can process data, such as information (e.g., voice or data information) relating to operations performed by the transceiver component 600, etc., to facilitate transmitting signals, receiving signals, generating auxiliary signals, calibrating or adjusting the set of sub-ADCs 610 and the auxiliary sub-ADC 612, calibrating or adjusting information or paths associated with sub-ADCs in the set 610 and the auxiliary sub-ADC 612, performing channel estimation, performing calculations, configuring filters, filtering signals, and/or performing other operations; and can control data flow between the transceiver component 600 and other components associated with (e.g., connected to) the transceiver component 600 and can control data flow between various components of the transceiver component 600.

In yet another aspect, the transceiver component 600 also can include a data store 642 that can store data structures (e.g., voice information, data, metadata); code structure(s) (e.g., modules, objects, classes, procedures), commands, or instructions; information relating to transmitting signals, receiving signals, generating auxiliary signals, calibrating or adjusting the set of sub-ADCs 610 and the auxiliary sub-ADC 612, calibrating or adjusting information or paths associated with the set of sub-ADCs 610 and the auxiliary sub-ADC 612, performing channel estimation, performing calculations, configuring filters, filtering signals, and/or performing other operations; parameter data; information relating to algorithms (e.g., algorithm(s) relating to calibrating sub-ADCs, algorithm(s) relating to configuring an analog or digital filter, algorithm(s) (e.g., the defined alignment algorithm) relating to aligning the auxiliary sub-ADC 612 with a sub-ADC of the set 610, algorithm(s) relating to channel estimation, etc.); defined path correction criterion(s); and so on. In an aspect, the processor component 640 can be functionally coupled (e.g., through a memory bus) to the data store 642 in order to store and retrieve information desired to operate and/or confer functionality, at least in part, to the transmitter component 602, receiver component 604, interleaver component 606, ADC component 608, calibration component 614, etc., and/or substantially any other operational aspects of the transceiver component 600. It is to be appreciated and understood that the various components of the transceiver component 600 can communicate information between each other and/or between other components associated with the transceiver component 600 as desired to carry out operations of the transceiver component 600. It is to be further appreciated and understood that respective components (e.g., transmitter component 602, receiver component 604, interleaver component 606, ADC component 608, calibration component 614, etc.) of the transceiver component 600 each can be a stand-alone unit, can be included within the transceiver component 600 (as depicted), can be incorporated within another component of the transceiver component 600 or a component separate from the transceiver component 600, and/or virtually any suitable combination thereof, as desired.

Figure 7:
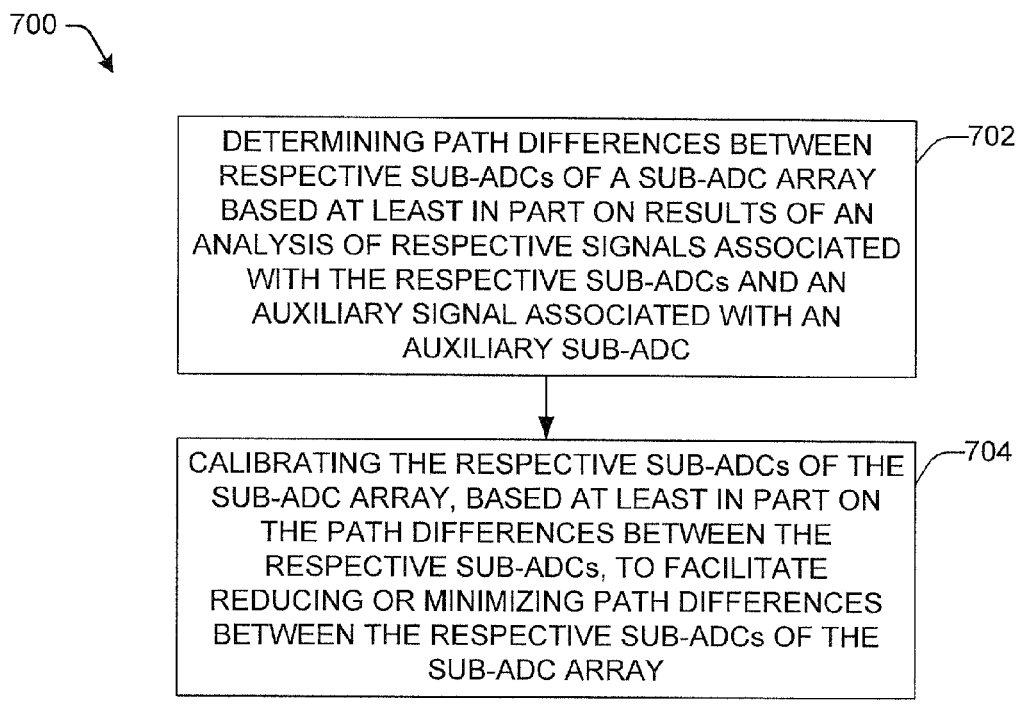
FIG. 7 illustrates a flow diagram of an example, non-limiting embodiment of a method that can facilitate calibrating sub-ADCs of an array of sub-ADCs of a transceiver component to facilitate correcting or mitigating sub-ADC path differences, in accordance with various aspects and embodiments of the disclosed subject matter.
Figure 8:
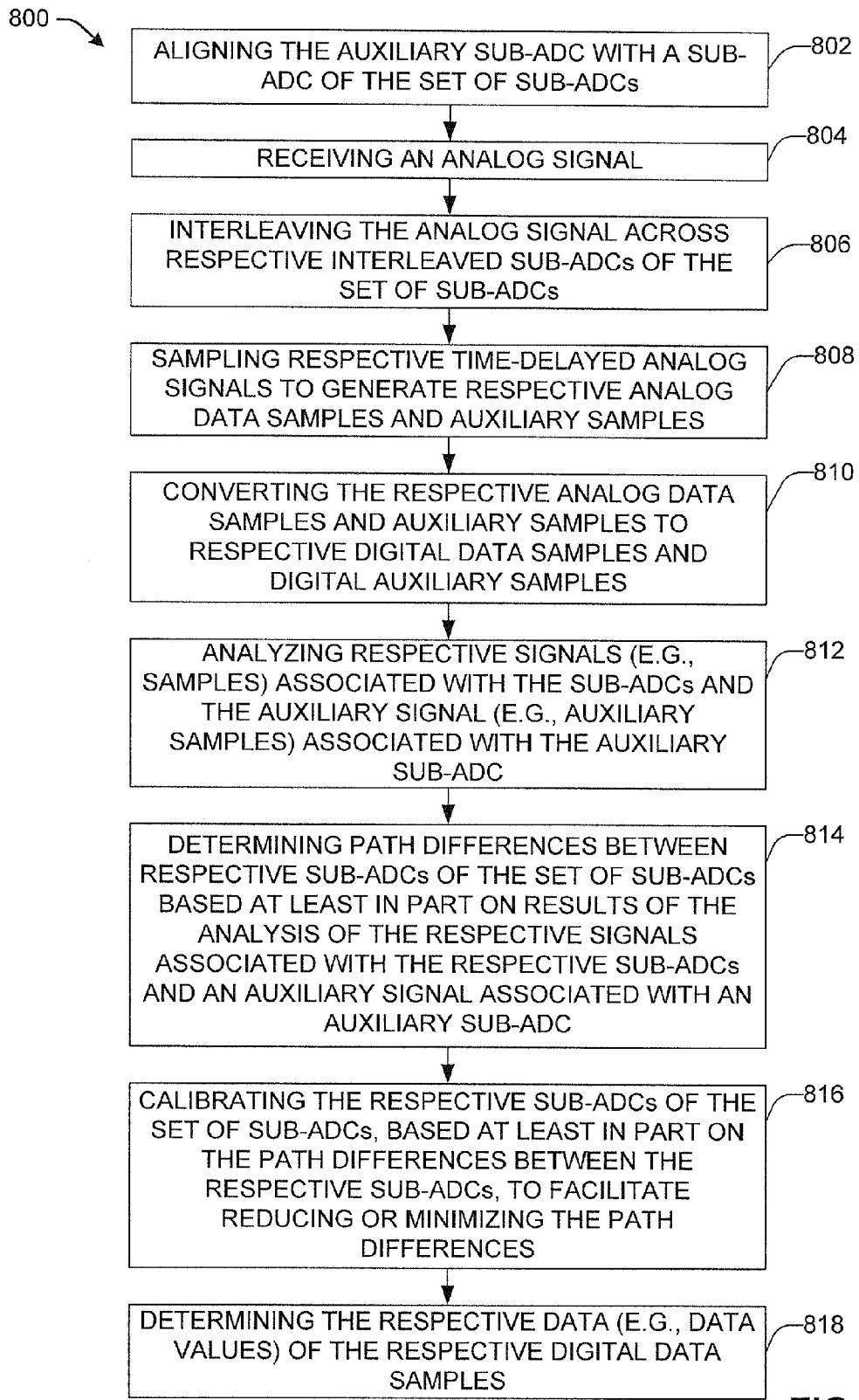
FIG. 8 depicts a flow diagram of another example, non-limiting embodiment of a method that can facilitate calibrating sub-ADCs of an array of sub-ADCs of a transceiver component to facilitate correcting or mitigating sub-ADC path differences, in accordance with various aspects and embodiments of the disclosed subject matter.
Figure 9:
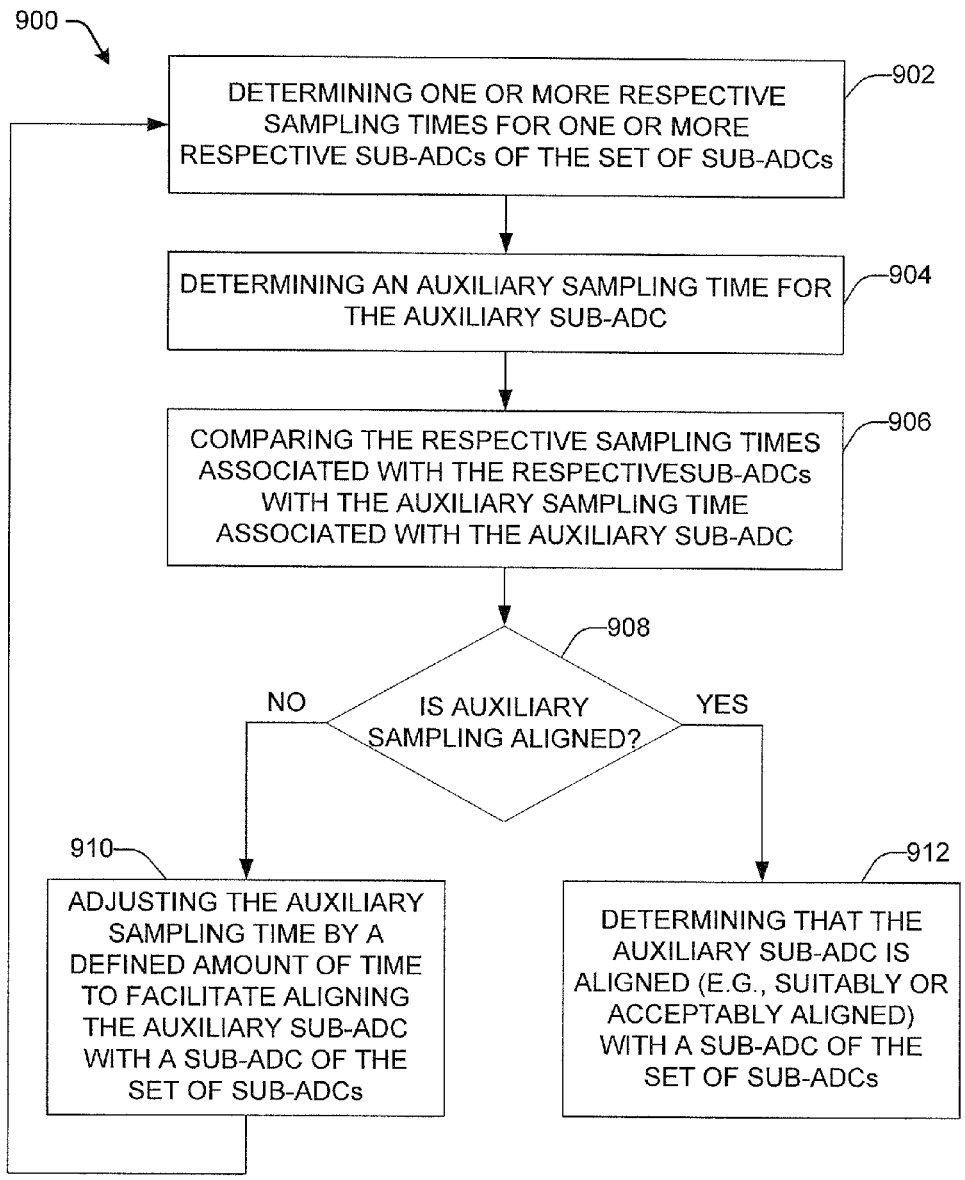
FIG. 9 presents a flow diagram of an example, non-limiting embodiment of a method that can align or calibrate an auxiliary sub-ADC (and associated auxiliary path) with a sub-ADC (and associated sub-ADC path) of a set (e.g., an array) of sub-ADCs, in accordance with various aspects and embodiments of the disclosed subject matter.

In view of the example systems described above, methods that may be implemented in accordance with the described subject matter may be better appreciated with reference to the flow charts of FIGS. 7-9. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 7 illustrates a flow diagram of an example method 700 that can facilitate calibrating sub-ADCs of an array of sub-ADCs of a transceiver component to facilitate correcting or mitigating sub-ADC path differences, in accordance with various aspects and embodiments of the disclosed subject matter. The method 700 can be implemented by a communication device, such as a transceiver component, which can comprise a calibration component and an ADC component, for example.

At block 702, path differences between respective sub-ADCs of a sub-ADC array can be determined based at least in part on results of an analysis of respective signals associated with the respective sub-ADCs and an auxiliary signal associated with an auxiliary sub-ADC. The communication device can receive an analog signal, comprising data, from another communication device. The sub-ADCs of the ADC component, which can be interleaved, can sample and digitize the analog signal, wherein the respective sub-ADCs can receive the analog signal with respective time-delays. The data (e.g., digital data) can be recovered from the digitized data samples (e.g., after the digitized data samples are decoded by a decoder component).

In addition to the sub-ADCs that can convert analog data signals to digital data signals, the ADC component can comprise the auxiliary sub-ADC, wherein an auxiliary signal can be routed via an auxiliary path associated with the auxiliary sub-ADC. The calibration component can analyze (e.g., evaluate, compare) the respective signals associated with the respective sub-ADCs and the auxiliary signal associated with the auxiliary sub-ADC. Based at least in part on the analysis results, the calibration component can determine the path differences between the respective sub-ADCs of the sub-ADC array, for example, as disclosed herein. The path differences can relate to, example, timing skews between respective paths of the sub-ADCs, path channel or bandwidth mismatches between respective sub-ADC paths, or other types of path differences or errors between respective sub-ADC paths that can cause distortion in the recovered digital data stream generated by the ADC component in response to the received analog signal.

At block 704, the respective sub-ADCs of the sub-ADC array can be calibrated, based at least in part on the path differences between the respective sub-ADCs, to facilitate reducing or minimizing path differences between the respective sub-ADCs of the sub-ADC array. The calibration component can determine one or more calibrations or adjustments that can be applied to one or more of the respective sub-ADCs of the sub-ADC array, based at least in part on the determined path differences between the respective sub-ADCs of the sub-ADC array, to facilitate reducing, minimizing, correcting, or mitigating path differences between the respective sub-ADCs of the sub-ADC array. For instance, the calibration component can determine a timing adjustment, a bandwidth adjustment, a transfer function, or other type of calibration that can be applied to one or more of the respective sub-ADCs, based at least in part on the determined path differences between the respective sub-ADCs, to calibrate the respective sub-ADCs. The calibration of the sub-ADCs can facilitate reducing or mitigating distortions in the digital data stream that otherwise may have been caused as a result of the uncorrected or unmitigated path differences.

The communication device also can comprise a combiner component that can combine or integrate the respective digital data substreams from the respective sub-ADCs to generate a digital data stream that can correspond to the data from the received analog signal. As desired, the digital data stream can be further processed (e.g., using an equalizer component and/or decoder component) or can be provided (e.g., presented or displayed) as an output.

FIG. 8 depicts a flow diagram of another example method 800 that can facilitate calibrating sub-ADCs of an array of sub-ADCs of a transceiver component to facilitate correcting or mitigating sub-ADC path differences, in accordance with various aspects and embodiments of the disclosed subject matter. The method 800 can be implemented by a communication device, such as a transceiver component, which can comprise an interleaver component, an ADC component comprising an auxiliary sub-ADC and a set of sub-ADCs, a calibration component, a decoder component, and a combiner component, for example.

At block 802, the auxiliary sub-ADC can be aligned with a sub-ADC of the set of sub-ADCs. The calibration component can align or calibrate (e.g., initially align or calibrate, or re-align or re-calibrate) the auxiliary sub-ADC with a sub-ADC of the set of sub-ADCs. The calibration component can align or calibrate the auxiliary sub-ADC with a sub-ADC of the set of sub-ADCs to enable the sampling of the auxiliary sub-ADC to be aligned with the sub-ADC. The calibration component can comprise or be associated with a phase interpolator component and/or can employ a delay line(s) (e.g., analog delay line(s)) that can be used to facilitate aligning or calibrating the auxiliary sub-ADC with the sub-ADC, as disclosed herein. For instance, the calibration component can select an auxiliary sampling rate, and can align the auxiliary sampling time associated with the auxiliary sub-ADC with a sampling time associated with a sub-ADC, to enable the sampling of the auxiliary signal associated with the auxiliary path of the auxiliary sub-ADC to occur at the same or at least substantially the same time as a subset of the sampling times associated with the sub-ADC.

At block 804, an analog signal, comprising data, can be received. The communication device can receive the analog signal from another communication device via a wireline or wireless communication channel or medium.

At block 806, the analog signal can be interleaved across respective interleaved sub-ADCs of a set (e.g., an array) of sub-ADCs. An interleaver component can facilitate interleaving the analog signal across the respective sub-ADCs, wherein the respective sub-ADCs can receive the analog signal with respective time-delays from the interleaver component.

At block 808, the respective time-delayed analog signals associated with the respective sub-ADCs and an auxiliary signal associated with the auxiliary sub-ADC can be sampled to generate respective analog data samples associated with the respective sub-ADCs and auxiliary samples associated with the auxiliary sub-ADC to facilitate digitizing the respective time-delayed analog signals and to facilitate determining path differences between the respective sub-ADCs. The respective sub-ADCs (or a sampler component associated with the sub-ADCs) can sample the respective time-delayed analog signals to generate the respective analog data samples, wherein the respective sub-ADCs can be sampled at respective sampling times (e.g., a first sub-ADC can be sampled at times 0, 2t, 4t, 6t, and so on, whereas a second sub-ADC can be sampled at times 1t, 3t, 5t, 7t, and so on). The auxiliary sub-ADC (or an auxiliary sampler associated with the auxiliary sub-ADC) can be sampled at a sampling rate that can enable the auxiliary sub-ADC to sample the auxiliary signal at times that can correspond to one or more respective sampling times of each of the sub-ADCs of the set of sub-ADCs over a defined period of time.

In some implementations, the sampling rate associated with the auxiliary sub-ADC can be a lower rate than the sampling rate associated with the sub-ADCs. For example, if the set of sub-ADCs comprises the first sub-ADC and the second sub-ADC that are sampled at respective times, as indicated above, the calibration component (or another component) can set the sampling rate associated with the auxiliary path (and auxiliary sub-ADC) to sample at a slower rate, such as every 5t, wherein the auxiliary signal can be sampled by the auxiliary sub-ADC or sampler at 5t, 10t, 15t, 20t, and so on.

At block 810, the respective analog data samples and the auxiliary sample can be converted to respective digital data samples and a digital auxiliary samples. The respective sub-ADCs can analyze the respective analog data samples and can digitize or convert the analog data samples to the respective digital data samples, wherein the respective digital data samples can correspond to the respective analog data samples. The auxiliary sub-ADC can analyze the analog auxiliary samples and can digitize or convert the analog auxiliary samples to a corresponding digital auxiliary samples.

At block 812, respective signals (e.g., analog or digital data samples) associated with the sub-ADCs and the auxiliary signal (e.g., analog or digital auxiliary samples) associated with the auxiliary sub-ADC can be analyzed. The calibration component can analyze (e.g., evaluate, compare) the respective signals associated with the sub-ADCs and the auxiliary signal associated with the auxiliary sub-ADC to facilitate determining path differences between respective sub-ADCs of the set of sub-ADCs. For example, the calibration component can evaluate or compare characteristics associated with the auxiliary signal in relation to respective characteristics associated with the respective signals associated with the sub-ADCs to facilitate determining the path differences between respective sub-ADCs.

At block 814, path differences between respective sub-ADCs of the set of sub-ADCs can be determined based at least in part on results of the analysis of the respective signals associated with the respective sub-ADCs and an auxiliary signal associated with an auxiliary sub-ADC. The calibration component can determine the path differences between respective sub-ADCs based at least in part on the results of analyzing (e.g., evaluating, comparing) characteristics associated with the auxiliary signal and the respective characteristics associated with the respective signals associated with the sub-ADCs.

At block 816, the respective sub-ADCs of the set of sub-ADCs can be calibrated, based at least in part on the path differences between the respective sub-ADCs, to facilitate reducing or minimizing path differences between the respective sub-ADCs. The calibration component can determine one or more calibrations or adjustments that can be applied to one or more of the respective sub-ADCs of the set of sub-ADCs, based at least in part on the determined path differences (e.g., timing skew(s), bandwidth difference(s), other path difference(s)) between the respective sub-ADCs, to facilitate reducing, minimizing, correcting, or mitigating path differences between the respective sub-ADCs of the sub-ADC array, such as disclosed herein.

With the sub-ADCs of the set of sub-ADCs calibrated by the calibration component, the respective sub-ADCs can operate to produce respective digital data substreams comprising respective digital data samples, wherein distortion or error for a digital data substream can be reduced or minimized when the respective digital data substreams are combined to generate the digital data stream. Thus, the calibration component and the method 800 can facilitate mitigating distortions that would otherwise have been caused as a result of uncorrected or unmitigated path differences.

At block 818, the respective data (e.g., data values) of the respective digital data samples can be determined. In some implementations, the combiner component can combine or integrate the respective digital data substreams (e.g., the respective digital data samples) of the respective sub-ADCs to generate a digital data stream, wherein the digital data stream can comprise data that can correspond to the data (e.g., in analog form) contained in the received analog signal. The decoder component can decode the digital data stream, comprising the digital data samples, to facilitate recovering (e.g., determining) the respective data from (of) the respective digital data samples. As desired, the respective data can be further processed or can be provided (e.g., presented or displayed) as an output.

FIG. 9 presents a flow diagram of an example method 900 that can align or calibrate an auxiliary sub-ADC (and associated auxiliary path) with a sub-ADC (and associated sub-ADC path) of a set (e.g., an array) of sub-ADCs, in accordance with various aspects and embodiments of the disclosed subject matter. The method 900 can be implemented by a communication device, such as a transceiver component, which can comprise an ADC component and a calibration component, for example. The ADC component can comprise an auxiliary sub-ADC and a set of sub-ADCs, wherein the set of sub-ADCs can be employed to convert analog signals to digital signals, and the auxiliary sub-ADC can be employed to facilitate calibrating the set of sub-ADCs. The auxiliary sub-ADC can comprise or be associated with, and can employ, a phase interpolator component and/or can employ delay lines (e.g., analog delay lines) to facilitate aligning or calibrating the auxiliary sub-ADC with a sub-ADC of the set of sub-ADCs, as disclosed herein.

At block 902, one or more respective sampling times can be determined for one or more respective sub-ADCs of the set of sub-ADCs. At block 904, an auxiliary sampling time can be determined for the auxiliary sub-ADC. The calibration component can determine the respective sampling times associated with the respective sub-ADCs and the auxiliary sampling time associated with the auxiliary sub-ADC.

At block 906, the respective sampling times associated with the respective sub-ADCs can be compared with the auxiliary sampling time associated with the auxiliary sub-ADC. The calibration component can analyze the respective sampling times and the auxiliary sampling time. As part of the analysis, the calibration component can compare the respective sampling times with the auxiliary sampling time.

At block 908, a determination can be made regarding whether the auxiliary sampling time is aligned (or at least substantially aligned) with any one of the respective sampling times associated with the respective sub-ADCs. Based at least in part on the results of the comparison of the respective sampling times with the auxiliary sampling time, the calibration component can determine whether the auxiliary sampling time is aligned (or at least substantially aligned) with any one of the respective sampling times.

If it is determined that the auxiliary sampling time is not aligned (or is not at least substantially aligned) with any one of the respective sampling times associated with the respective sub-ADCs, at block 910, the auxiliary sampling time can be adjusted by a defined amount of time to facilitate aligning the auxiliary sub-ADC with a sub-ADC of the set of sub-ADCs. For example, if the auxiliary sampling time starts with a sampling error or offset of 0.2t, instead of sampling at time 0, and a sub-ADC of the set is associated with a sampling time that starts with a sampling error or offset of 0.1t, the calibration component can determine that the auxiliary sampling time is not aligned (or is not at least substantially aligned) with the sampling time associated with the sub-ADC. The calibration component can determine a time adjustment amount, or can use a defined (e.g., predefined) time adjustment amount (e.g., −0.1t, +0.1t, or some other desired time adjustment amount), to apply to the auxiliary sampling time to facilitate adjusting the auxiliary sampling time to facilitate aligning (or substantially aligning) the auxiliary sub-ADC with a sub-ADC of the set. The calibration component can employ the phase interpolator component and/or analog delay lines to facilitate adjusting the auxiliary sampling time of the auxiliary sub-ADC by the desired time adjustment amount. At this point, as the auxiliary sub-ADC is not aligned (or substantially aligned) with a sub-ADC of the set, the method 900 can return to block 902 and can proceed from that point.

Referring again to block 908, if, at block 908, it is determined that the auxiliary sampling time is aligned (or at least substantially aligned) with one of the respective sampling times associated with a sub-ADC of the set of sub- ADCs, at block 912, it can be determined that the auxiliary sub-ADC is aligned (e.g., suitably or acceptably aligned) with a sub-ADC of the set of sub-ADCs. If, based at least in part on the comparison results, the calibration component determines that the auxiliary sampling time is aligned (or at least substantially aligned) with one of the respective sampling times associated with a sub-ADC of the set, the calibration component can determine that the auxiliary sub-ADC is aligned (e.g., suitably or acceptably aligned) with a sub-ADC of the set. The alignment of the auxiliary sub-ADC with the sub-ADC can enable the auxiliary sub-ADC to be used by the calibration component to facilitate determining path differences between paths associated with respective sub-ADCs and calibrating the respective sub-ADCs to correct, mitigate, or reduce those path differences.

As an example of the implementation of the method 900, if a first analog signal of a first sub-ADC of the set of sub-ADCs is set to be sampled at times 0, 2t, 4t, 6t, 8t, 10t, 18t, 20t, 22t, and so on, the calibration component can select the auxiliary sampling rate (e.g., every 5t), and can align the sampling times (e.g., 10t, 20t, 30t, and so on) associated with the auxiliary sub-ADC with certain sampling times associated with the first sub-ADC, to enable the sampling of the auxiliary signal associated with the auxiliary path of the auxiliary sub-ADC to occur at the same or at least substantially the same time as a subset of the sampling times (e.g., 10t, 20t, 30t, and so on) associated with the first sub-ADC. As another illustrative example, if, instead, a first analog signal of a first sub-ADC of the set of sub-ADCs is set or determined to be sampled at times (0+0.1)t, (2+0.1)t, (4+0.1)t, (6+0.1)t, (8+0.1)t, (10+0.1)t, (18+0.1)t, (20+0.1)t, (22+0.1)t, and so on, the calibration component can select the auxiliary sampling rate (e.g., every 5t), and can align the sampling times (e.g., (10+0.1)t, (20+0.1)t, (30+0.1)t, and so on) associated with the auxiliary sub-ADC with the sampling time associated with the first sub-ADC, to enable the sampling of the auxiliary signal associated with the auxiliary path of the auxiliary sub-ADC to occur at the same or at least substantially the same time as a subset of the sampling times (e.g., (10+0.1)t, (20+0.1)t, (30+0.1)t, and so on) associated with the first sub-ADC.

Example Computing Environment

Figure 10:
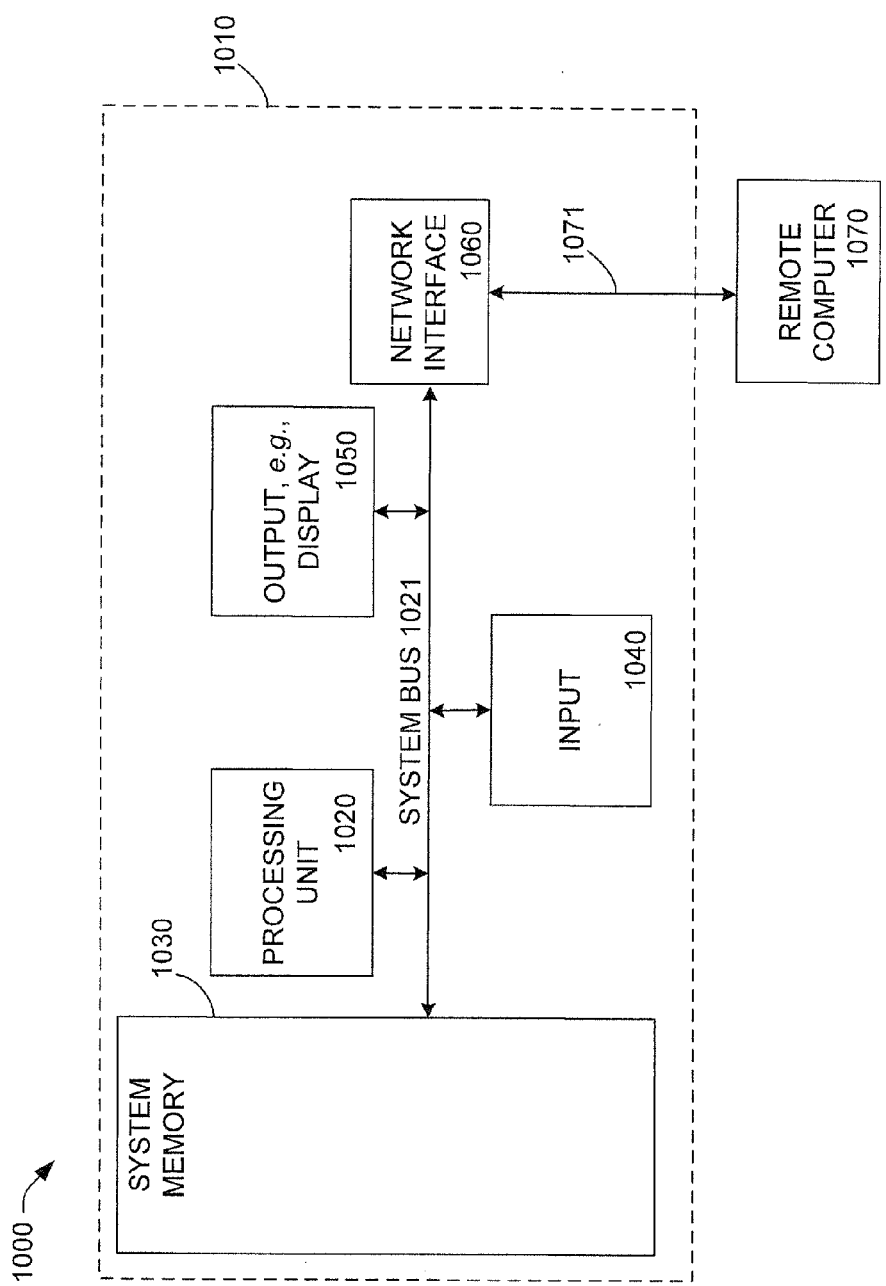
FIG. 10 illustrates a block diagram of an example electronic computing environment that can be implemented in conjunction with one or more aspects described herein.

As mentioned, advantageously, the techniques described herein can be applied to any device and/or network where calibration of ADC sub-components of an ADC component is desirable in a system comprising a communication device (e.g., transceiver component). It is to be understood, therefore, that handheld, portable and other computing devices and computing objects of all kinds are contemplated for use in connection with the various non-limiting embodiments, e.g., anywhere that it can be desirable for a device to implement calibration of ADC sub-components of an ADC component associated with a system that is associated with a communication device. Accordingly, the below general purpose remote computer described below in FIG. 10 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 10 thus illustrates an example of a suitable computing system environment 1000 in which some aspects of the disclosed subject matter can be implemented, although as made clear above, the computing system environment 1000 is only one example of a suitable computing environment for a device and is not intended to suggest any limitation as to the scope of use or functionality of the disclosed subject matter. Neither should the computing environment 1000 be interpreted as having any dependency or requirement relating to any one or combination of components illustrated in the exemplary operating environment 1000.

With reference to FIG. 10, an exemplary device for implementing the disclosed subject matter includes a general-purpose computing device in the form of a computer 1010. Components of computer 1010 may include, but are not limited to, a processing unit 1020, a system memory 1030, and a system bus 1021 that couples various system components including the system memory to the processing unit 1020. The system bus 1021 may be any of several types of bus structures including a memory bus or memory controller, a peripheral bus, and a local bus using any of a variety of bus architectures.

Computer 1010 typically includes a variety of computer readable media. Computer readable media can be any available media that can be accessed by computer 1010. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1010. Communication media typically embodies computer readable instructions, data structures, program modules, or other data in a modulated data signal such as a carrier wave or other transport mechanism and includes any information delivery media.

The system memory 1030 may include computer storage media in the form of volatile and/or nonvolatile memory such as read only memory (ROM) and/or random access memory (RAM). A basic input/output system (BIOS), containing the basic routines that help to transfer information between elements within computer 1010, such as during start-up, may be stored in memory 1030. Memory 1030 typically also contains data and/or program modules that are immediately accessible to and/or presently being operated on by processing unit 1020. By way of example, and not limitation, memory 1030 may also include an operating system, application programs, other program modules, and program data.

The computer 1010 may also include other removable/non-removable, volatile/nonvolatile computer storage media. For example, computer 1010 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1021 through a non-removable memory interface such as an interface, and a magnetic disk drive or optical disk drive is typically connected to the system bus 1021 by a removable memory interface, such as an interface.

A user can enter commands and information into the computer 1010 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1020 through user input 1040 and associated interface(s) that are coupled to the system bus 1021, but may be connected by other interface and bus structures, such as a parallel port, game port, or a universal serial bus (USB). A graphics subsystem can also be connected to the system bus 1021. A projection unit in a projection display device, or a HUD in a viewing device or other type of display device can also be connected to the system bus 1021 via an interface, such as output interface 1050, which may in turn communicate with video memory. In addition to a monitor, computers can also include other peripheral output devices such as speakers which can be connected through output interface 1050.

The computer 1010 can operate in a networked or distributed environment using logical connections to one or more other remote computer(s), such as remote computer 1070, which can in turn have media capabilities different from device 1010. The remote computer 1070 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 1010. The logical connections depicted in FIG. 10 include a network 1071, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1010 can be connected to the LAN 1071 through a network interface or adapter. When used in a WAN networking environment, the computer 1010 can typically include a communications component, such as a modem, or other means for establishing communications over the WAN, such as the Internet. A communications component, such as wireless communications component, a modem and so on, which can be internal or external, can be connected to the system bus 1021 via the user input interface of input 1040, or other appropriate mechanism. In a networked environment, program modules depicted relative to the computer 1010, or portions thereof, can be stored in a remote memory storage device. It will be appreciated that the network connections shown and described are exemplary and other means of establishing a communications link between the computers can be used.

Example Networking Environment

Figure 11:
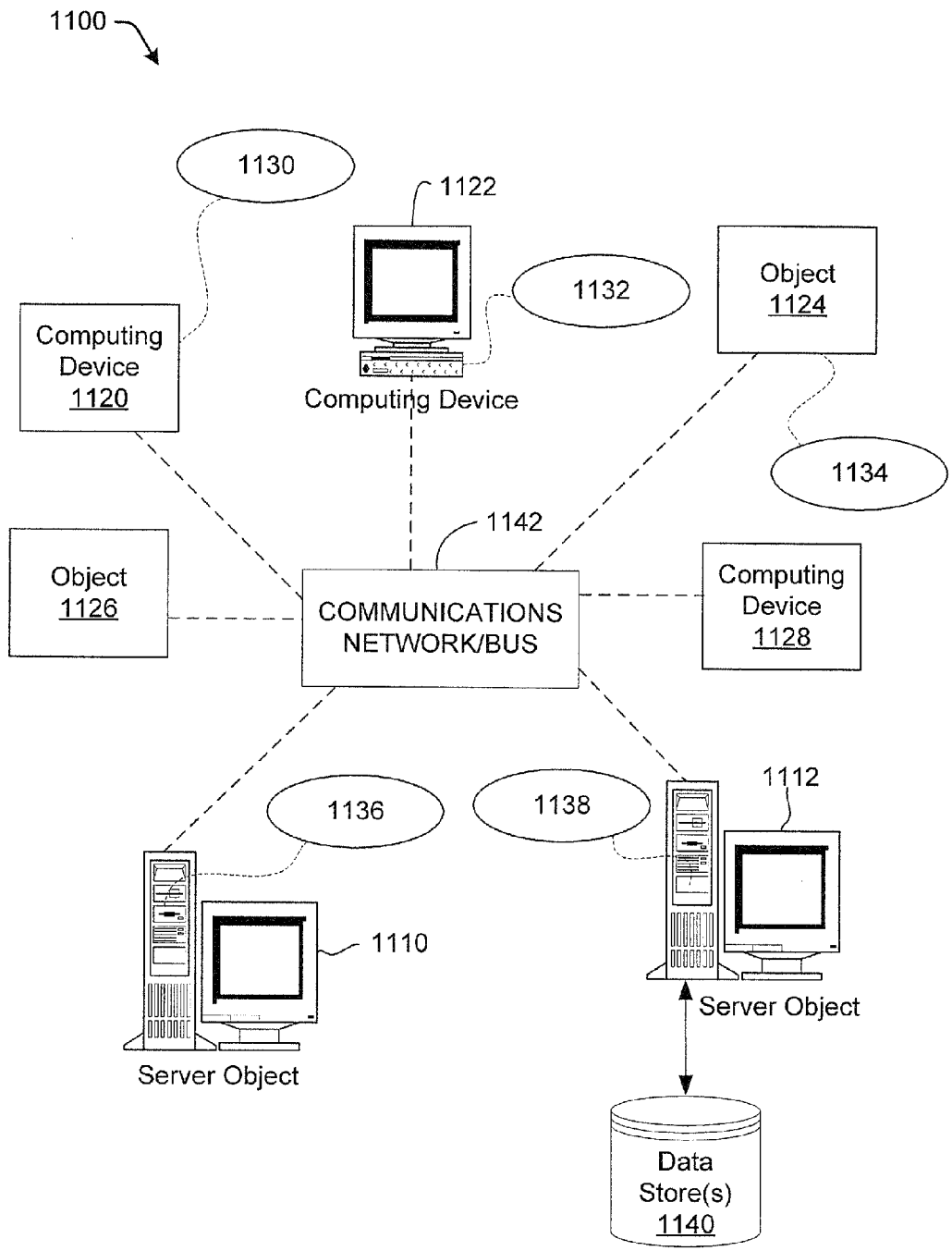
FIG. 11 illustrates a block diagram of an example data communication network that can be operable in conjunction with various aspects described herein.

FIG. 11 provides a schematic diagram of an exemplary networked or distributed computing environment 1100. The distributed computing environment comprises computing objects 1110, 1112, etc. and computing objects or devices 1120, 1122, 1124, 1126, 1128, etc., which may include programs, methods, data stores, programmable logic, etc., as represented by applications 1130, 1132, 1134, 1136, 1138 and data store(s) 1140. It can be appreciated that computing objects 1110, 1112, etc. and computing objects or devices 1120, 1122, 1124, 1126, 1128, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1140 can include one or more cache memories, one or more registers, or other similar data stores disclosed herein.

Each computing object 1110, 1112, etc. and computing objects or devices 1120, 1122, 1124, 1126, 1128, etc. can communicate with one or more other computing objects 1110, 1112, etc. and computing objects or devices 1120, 1122, 1124, 1126, 1128, etc. by way of the communications network 1142, either directly or indirectly. Even though illustrated as a single element in FIG. 11, communications network 1142 may comprise other computing objects and computing devices that provide services to the system of FIG. 11, and/or may represent multiple interconnected networks, which are not shown. Each computing object 1110, 1112, etc. or computing object or devices 1120, 1122, 1124, 1126, 1128, etc. can also contain an application, such as applications 1130, 1132, 1134, 1136, 1138, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 11, as a non-limiting example, computing objects or devices 1120, 1122, 1124, 1126, 1128, etc. can be thought of as clients and computing objects 1110, 1112, etc. can be thought of as servers where computing objects 1110, 1112, etc., acting as servers provide data services, such as receiving data from client computing objects or devices 1120, 1122, 1124, 1126, 1128, etc., storing of data, processing of data, transmitting data to client computing objects or devices 1120, 1122, 1124, 1126, 1128, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1142 or bus is the Internet, for example, the computing objects 1110, 1112, etc. can be Web servers with which other computing objects or devices 1120, 1122, 1124, 1126, 1128, etc. communicate via any of a number of known protocols, such as the hypertext transfer protocol (HTTP). Computing objects 1110, 1112, etc. acting as servers may also serve as clients, e.g., computing objects or devices 1120, 1122, 1124, 1126, 1128, etc., as may be characteristic of a distributed computing environment.

Reference throughout this specification to "one embodiment," "an embodiment," "an example," "an implementation," "a disclosed aspect," or "an aspect" means that a particular feature, structure, or characteristic described in connection with the embodiment, implementation, or aspect is included in at least one embodiment, implementation, or aspect of the present disclosure. Thus, the appearances of the phrase "in one embodiment," "in one example," "in one aspect," "in an implementation," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methodologies for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A communication system, comprising:
a converter component comprising a set of converter sub-components for converting respective time-delayed analog signals, associated with an analog signal received from a remote communication component, to respective digital data samples, and an auxiliary converter sub-component associated with an auxiliary path, wherein respective converter sub-components of the set of converter sub-components are associated with respective paths; and
a calibration component for determining path differences between the respective paths of the respective converter sub-components, based at least in part on a result of an analysis of an auxiliary signal associated with the auxiliary path and respective signals associated with the respective paths of the respective converter sub-components, to facilitate calibration of the respective converter sub-components to reduce the path differences, wherein the respective signals comprise the respective digital data samples.

2. The system of claim 1, wherein, to facilitate the analysis, the calibration component compares information relating to a set of auxiliary samples, based at least in part on the auxiliary signal, with information relating to respective sets of the digital data samples, based at least in part on the respective signals, and determines the path differences between the respective paths based at least in part on respective differences between the information relating to the set of auxiliary samples and the information relating to the respective sets of digital data samples.

3. The system of claim 2, wherein, to facilitate the determining of the path differences, the calibration component determines a squared difference error metric based at least in part on the respective differences between the information relating to the set of auxiliary samples and the information relating to the respective sets of digital data samples.

4. The system of claim 3, wherein the calibration component calculates the squared difference error metric based at least in part on a difference between auxiliary-sample-related information relating to a first auxiliary sample of the set of auxiliary samples and sample-related information relating to a first digital data sample of a first set of the respective sets of digital data samples that is associated with a first converter sub-component of the set of converter sub-components, wherein an auxiliary sampling time of the first auxiliary sample coincides with a sampling time of the first digital data sample.

5. The system of claim 4, wherein the calibration component calculates the squared difference error metric based at least in part on a second difference between second auxiliary-sample-related information relating to a second auxiliary sample of the set of auxiliary samples and sample-related information relating to a second digital data sample of a second set of the respective sets of digital data samples that is associated with a second converter sub-component of the set of converter sub-components, wherein a second auxiliary sampling time of the second auxiliary sample coincides with a second sampling time of the second digital data sample.

6. The system of claim 3, wherein the squared difference error metric is at least one of an average squared difference error metric or a median squared difference error metric, and the calibration component calculates at least one of the average squared difference error metric or the median squared difference error metric based at least in part on a difference between auxiliary-sample-related information relating to an average value or a median value associated with multiple auxiliary samples of the set of auxiliary samples and sample-related information relating to another average value or another median value associated with multiple digital data samples of a first set of the respective sets of digital data samples that is associated with a first converter sub-component of the set of converter sub-components, the respective auxiliary sampling times of the multiple auxiliary samples coincide with respective sampling times of the multiple digital data samples.

7. The system of claim 1, wherein the calibration component aligns the auxiliary path associated with the auxiliary converter sub-component with a path associated with a converter sub-component of the set of converter sub-components to facilitate enabling sampling of the auxiliary signal by the auxiliary converter sub-component to coincide with a portion of sampling of a signal by the converter sub-component.

8. The system of claim 7, wherein the calibration component adjusts at least one parameter associated with the auxiliary path to facilitate the alignment of the auxiliary paths with the path.

9. The system of claim 8, further comprising at least one of a phase interpolator component or an analog delay line that is employed to facilitate the adjustment of the at least one parameter associated with the auxiliary path, wherein the at least one parameter comprises a phase parameter or a time parameter.

10. The system of claim 1, wherein the calibration component determines a calibration to be performed on at least one path of the respective paths or at least one converter sub-component of the set of converter sub-components to reduce the path differences, and facilitates performance of the calibration on the at least one path or the at least one converter sub-component.

11. The system of claim 1, wherein the path differences comprise at least one of a timing skew between two paths of two converter sub-components of the set of converter sub-components, or a bandwidth difference between the two paths of the two converter sub-components.

12. The system of claim 1, wherein the calibration component determines an analog delay line to be applied to a path associated with a converter sub-component of the set of converter sub-components to facilitate calibration of the path and the converter sub-component to facilitate the reduction of the path differences, comprising a timing skew associated with the path.

13. The system of claim 1, wherein the path differences comprise a transfer function difference, and the calibration component determines the transfer function difference between the respective paths of the respective converter sub-components, based at least in part on the result of the analysis of the auxiliary signal and the respective signals, and calibrates at least one of the respective converter sub-components to reduce the path differences.

14. The system of claim 1, wherein the calibration component frequency locks an auxiliary sampling clock associated with the auxiliary converter sub-component to a sampling clock associated with a converter sub-component of the set of converter sub-components and configures the auxiliary converter sub-component to have an auxiliary jitter that is higher than a jitter associated with the converter sub-component.

15. The system of claim 1, wherein the path differences comprise a timing difference between the respective paths of the respective converter sub-components, and the calibration component determines a timing offset that reduces the timing difference between the respective paths of the respective converter sub-components, based at least in part on the result of the analysis of the auxiliary signal and the respective signals, and applies the timing offset to a path associated with at least one of the respective converter sub-components to adjust the path to calibrate the path and the at least one of the respective converter sub-components to reduce the path differences.

16. The system of claim 1, wherein the calibration component determines at least one of an analog filter or a digital filter to apply to at least one path of the respective paths, based at least in part on the result of the analysis of the auxiliary signal and the respective signals, and applies at least one of the analog filter or the digital filter to the at least one path to calibrate the path and the at least one of the respective converter sub-components to reduce the path differences.

17. A signal processing method within a transceiver, comprising:
   determining, using at least a calibration component, path differences between respective paths of respective converter sub-components of a set of converter sub-components, based at least in part on a result of analyzing of an auxiliary signal associated with an auxiliary path that is associated with an auxiliary sub-component and respective signals associated with the respective paths of the respective converter sub-components of the set of converter sub-components, to facilitate calibrating the respective converter sub-components to mitigate the path differences; and
   adjusting the respective converter sub-components or the respective paths to facilitate the mitigating of the path differences between the respective converter sub-components or the respective paths using at least the calibration component.

18. The method of claim 17, wherein the analyzing further comprises:
   comparing information relating to a set of auxiliary samples, based at least in part on the auxiliary signal, with information relating to respective sets of samples, based at least in part on the respective signals, wherein the determining the path differences further comprises determining the path differences between the respective paths based at least in part on respective differences between the information relating to the set of auxiliary samples and the information relating to the respective sets of samples.

19. The method of claim 17, further comprising:
   determining a squared difference error based at least in part on the respective differences between the information relating to the set of auxiliary samples and the information relating to the respective sets of samples to facilitate determining the path differences.

20. The method of claim 17, further comprising:
   determining at least one of an average squared difference error metric or a median squared difference error metric based at least in part on a difference between auxiliary-sample-related information relating to an average value or a median value associated with multiple auxiliary samples of the set of auxiliary samples and sample-related information relating to another average value or another median value associated with multiple digital data samples of a first set of the respective sets of samples that is associated with a first converter sub-component of the set of converter sub-components, wherein respective auxiliary sampling times of the multiple auxiliary samples coincide with respective sampling times of the multiple digital data samples.

21. The method of claim 17, further comprising:
   adjusting at least one parameter associated with the auxiliary path associated with the auxiliary converter sub-component to facilitate aligning the auxiliary path with a path associated with a converter sub-component of the set of converter sub-components to facilitate enabling sampling of the auxiliary signal by the auxiliary converter sub-component to coincide with a portion of sampling of a signal by the converter sub-component.

22. The method of claim 17, further comprising:
sampling the auxiliary signal on the auxiliary path at a same time as a sampling of a first signal on a first path associated with a first converter sub-component of the set of converter sub-components; and
sampling the auxiliary signal on the auxiliary path at a same time as a sampling of a second signal on a second path associated with a second converter sub-component of the set of converter sub-components.

23. The method of claim 17, further comprising:
determining a calibration to be performed on at least one path of the respective paths or at least one converter sub-component of the set of converter sub-components to mitigate the path differences, wherein the adjusting the respective converter sub-components or the respective paths comprises performing the calibration on the at least one path or the at least one converter sub-component.

24. A transceiver, comprising:

means for determining path differences between respective paths of respective converter sub-components of a set of converter sub-components, based at least in part on a result of comparing an auxiliary signal associated with an auxiliary path that is associated with an auxiliary sub-component with respective signals associated with the respective paths of the respective converter sub-components of the set of converter sub-components, to facilitate calibrating the respective converter sub-components to reduce the path differences; and means for calibrating the respective converter sub-components or the respective paths to facilitate the reducing of the path differences between the respective converter sub-components or the respective paths.

\* \* \* \* \*